(12) United States Patent
Paek et al.

(10) Patent No.: US 11,574,605 B2
(45) Date of Patent: Feb. 7, 2023

(54) DISPLAY PANEL AND DISPLAY DEVICE INCLUDING THE SAME

(71) Applicant: LG DISPLAY CO., LTD., Seoul (KR)

(72) Inventors: Seung Han Paek, Paju-si (KR); Kyung Jae Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/383,684

(22) Filed: Jul. 23, 2021

(65) Prior Publication Data

US 2022/0051632 A1 Feb. 17, 2022

(30) Foreign Application Priority Data

Aug. 11, 2020 (KR) .......................... 10-2020-0100602

(51) Int. Cl.
*G09G 3/3291* (2016.01)
*B32B 17/10* (2006.01)
*H01L 27/32* (2006.01)

(52) U.S. Cl.
CPC ........... *G09G 3/3291* (2013.01); *B32B 17/10* (2013.01); *H01L 27/3276* (2013.01); *B32B 2457/206* (2013.01)

(58) Field of Classification Search
CPC .. G09G 3/3291; G09G 3/3233; G09G 3/3258; H01L 27/3276; B32B 17/10; B32B 17/00
See application file for complete search history.

(56) References Cited

U.S. PATENT DOCUMENTS

| | | | | |
|---|---|---|---|---|
| 8,827,536 | B2* | 9/2014 | Lee | H05K 5/0017 362/249.04 |
| 9,276,055 | B1* | 3/2016 | Son | H01L 27/1225 |
| 9,430,180 | B2* | 8/2016 | Hirakata | H01L 27/3276 |
| 9,600,112 | B2* | 3/2017 | Zhang | H05K 1/0393 |
| 10,028,339 | B2* | 7/2018 | Jung | G06F 3/041 |
| 10,394,069 | B2* | 8/2019 | Yamazaki | H01L 31/14 |
| 10,921,857 | B2* | 2/2021 | Kim | G09F 9/301 |
| 11,151,936 | B2* | 10/2021 | Lee | G09G 3/3233 |
| 11,343,922 | B2* | 5/2022 | Park | H04M 1/0266 |
| 2014/0118271 | A1* | 5/2014 | Lee | G06F 3/03547 345/173 |
| 2016/0316582 | A1* | 10/2016 | Seo | G02F 1/13 |
| 2018/0331124 | A1* | 11/2018 | Cho | H01L 27/1218 |

* cited by examiner

*Primary Examiner* — Sardis F Azongha
(74) *Attorney, Agent, or Firm* — Polsinelli PC

(57) ABSTRACT

A display panel includes a first display disposed on a first glass substrate; a second display disposed on a second glass substrate adjacent to the first glass substrate; and a first organic layer connecting the first glass substrate and the second glass substrate, wherein each of the first display and the second display includes a plurality of first gate lines disposed in a first direction, a plurality of first data lines disposed in a second direction crossing the first direction, and first subpixels defined by the plurality of first gate lines and the plurality of first data lines which cross each other, and wherein first wirings electrically connecting the first subpixels of the first display and the first subpixels of the second display are disposed on the first organic layer.

20 Claims, 21 Drawing Sheets

DISPLAY PANEL AND DISPLAY DEVICE INCLUDING THE SAME

CROSS-REFERENCE TO RELATED APPLICATION

This application claims priority to and the benefit of Korean Patent Application No. 10-2020-0100602 filed on Aug. 11, 2020, which is hereby incorporated by reference in its entirety.

BACKGROUND

Field of the Disclosure

The present disclosure relates to a display panel and a display device including the same. More particularly, the present disclosure relates to a display panel for a multi-display and the multi-display.

Description of the Background

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast and the luminous efficiency, luminance, and viewing angle are large. In the organic light emitting display device, an OLED (Organic Light Emitting Diode, referred to as "OLED") is formed in each pixel. The organic light-emitting display device has a fast response speed, excellent luminous efficiency, luminance, and viewing angle, and has excellent contrast ratio and color reproducibility since it can express black gradations in complete black.

Recently, there is an example of using a part of the side of a mobile terminal as a display area. This technology has a problem in that the resolution of the side display area is deteriorated and there is a difference in color, etc. between a front display area and the side display area.

SUMMARY

The present disclosure provides a display panel for a multi-display with improved image quality and color in a side display area, and a display device including the same.

The present disclosure also provides a bezel-less display device.

Further, the present disclosure solves the aforementioned needs and/or problems.

In a display panel according to an aspect of the disclosure, the display panel comprises a first display disposed on a first glass substrate; a second display disposed on a second glass substrate adjacent to the first glass substrate; and a first organic layer connecting the first glass substrate and the second glass substrate, wherein each of the first display and the second display includes a plurality of first gate lines disposed in a first direction, a plurality of first data lines disposed in a second direction crossing the first direction, and first subpixels defined by the plurality of first gate lines and the plurality of first data lines which cross each other, and wherein first wirings electrically connecting the first subpixels of the first display and the first subpixels of the second display are disposed on the first organic layer.

The display panel may further include a gate glass substrate adjacent to the second glass substrate and on which a gate driver supplying gate pulses to the plurality of first gate lines of the first and second displays is disposed; a second organic layer connecting the second glass substrate and the gate glass substrate; a data glass substrate adjacent to the first glass substrate and on which a data driver supplying data voltages to the plurality of first data lines of the first and second displays is disposed; and a third organic layer connecting the first glass substrate and the data glass substrate.

The display panel may further include second wirings disposed on the second organic layer and electrically connecting the gate driver and the second display; and third wirings disposed on the third organic layer and electrically connecting the data driver and the first display.

Each of the first to third wirings may include a plurality of ring structures connected in series.

Each of the first to third wirings may include a pattern bent at predetermined intervals.

The first wirings and the second wirings may be extended from the first gate lines of the first and second displays, and the third wirings may be extended from the first data lines of the first and second displays.

The display panel may further include an insulating layer disposed on the first organic layer and covering the first wirings; and auxiliary wirings disposed on the insulating layer, wherein the auxiliary wirings may be connected in parallel to the first wirings, respectively, through contact holes formed in the insulating layer.

Each of the first subpixels may include a first electrode, an organic compound layer disposed on the first electrode, and a second electrode disposed on the organic compound layer, and wherein the auxiliary wirings may include the same material as the first electrode.

The display panel may further include a third display disposed on a third glass substrate adjacent to the first glass substrate in the second direction; and a fourth organic layer connecting the first glass substrate and the third glass substrate, wherein the third display may include a plurality of second gate lines disposed in the first direction, a plurality of second data lines disposed in the second direction, and second subpixels defined by the plurality of second gate lines and the plurality of second data lines which cross each other, and wherein fourth wirings electrically connecting the first subpixels of the first display and the second subpixels of the third display may be disposed on the fourth organic layer.

The display panel may further include a gate glass substrate adjacent to the second glass substrate in the first direction and on which a second gate driver supplying gate pulses to the plurality of second gate lines is disposed; a second organic layer connecting the second glass substrate and the gate glass substrate; a data glass substrate adjacent to the third glass substrate in the second direction and on which a second data driver supplying data voltages to the plurality of second data line is disposed; and a fifth organic layer connecting the third glass substrate and the data glass substrate.

The display panel may further include second wirings disposed on the second organic layer and electrically connecting the second gate driver and the second display; and fifth wirings disposed on the fifth organic layer and electrically connecting the second data driver and the third display.

The first wirings and the second wirings may be extended from the plurality of second gate line, and the fourth wirings and the fifth wirings may be extended from the plurality of second data line.

Each of the first wirings may include a first main wiring disposed on the first organic layer, and a first auxiliary wiring connected in parallel to the first main wiring, and the first auxiliary wiring may be disposed on an insulating layer covering the first main wiring, and be connected to the first main wiring through a contact hole penetrating the insulating layer.

Each of the second subpixels may include a first electrode, an organic compound layer disposed on the first electrode, and a second electrode disposed on the organic compound layer, and the first auxiliary wiring may include the same material as the first electrode.

Each of the fourth wirings may include a fourth main wiring disposed on the fourth organic layer, and a fourth auxiliary wiring connected in parallel to the fourth main wiring, and the fourth auxiliary wiring may be disposed on an insulating layer covering the fourth main wiring, and be connected to the fourth main wiring through a contact hole penetrating the insulating layer.

Each of the second subpixels may include a first electrode, an organic compound layer disposed on the first electrode, and a second electrode disposed on the organic compound layer, and the fourth auxiliary wiring may include the same material as the first electrode.

Each of the first display and the second display may include a circuit layer disposed on the first and second glass substrates; a light-emitting element layer disposed on the circuit layer; an encapsulation layer covering the circuit layer and the light-emitting element layer; a polarizing plate disposed on the encapsulation layer; and a cover glass disposed on the polarizing plate. The first glass substrate and the second glass substrate may form a predetermined angle around the first organic layer, the first glass substrate and the data glass substrate may form a predetermined angle around the third organic layer, and the second glass substrate and the gate glass substrate may form a predetermined angle around the second organic layer.

The first glass substrate and the second glass substrate may form an angle ranging from 0 to 90 degrees, the first glass substrate and the data glass substrate may form an angle ranging from 90 to 180 degrees, and the second glass substrate and the gate glass substrate may form an angle ranging from 90 to 180 degrees.

Each of the first to third displays may include a circuit layer disposed on the first to third glass substrates; a light-emitting element layer disposed on the circuit layer; an encapsulation layer covering the circuit layer and the light-emitting element layer; a polarizing plate disposed on the encapsulation layer; and a cover glass disposed on the polarizing plate. The first glass substrate and the second glass substrate may form a predetermined angle around the first organic layer, the first glass substrate and the third glass substrate may form a predetermined angle around the fourth organic layer, the second glass substrate and the gate glass substrate may form a predetermined angle around the second organic layer, and the third glass substrate and the data glass substrate may form a predetermined angle around the fifth organic layer.

The first glass substrate and the second glass substrate form an angle ranging from 0 to 90 degrees. The first glass substrate and the third glass substrate may form an angle ranging from 0 to 90 degrees, the second glass substrate and the gate glass substrate may form an angle ranging from 90 to 180 degrees, and the third glass substrate and the data glass substrate may form an angle ranging from 90 to 180 degrees.

An aspect of the present disclosure may provide a display panel for a multi-display with improved image quality and color in a side display area, and a display device including the same.

An aspect of the present disclosure may provide a bezel-less display device.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above features and advantages of the present disclosure will become more apparent to those of ordinary skill in the art by describing exemplary aspects thereof in detail with reference to the attached drawings, in which.

DETAILED DESCRIPTION

Figure 1:
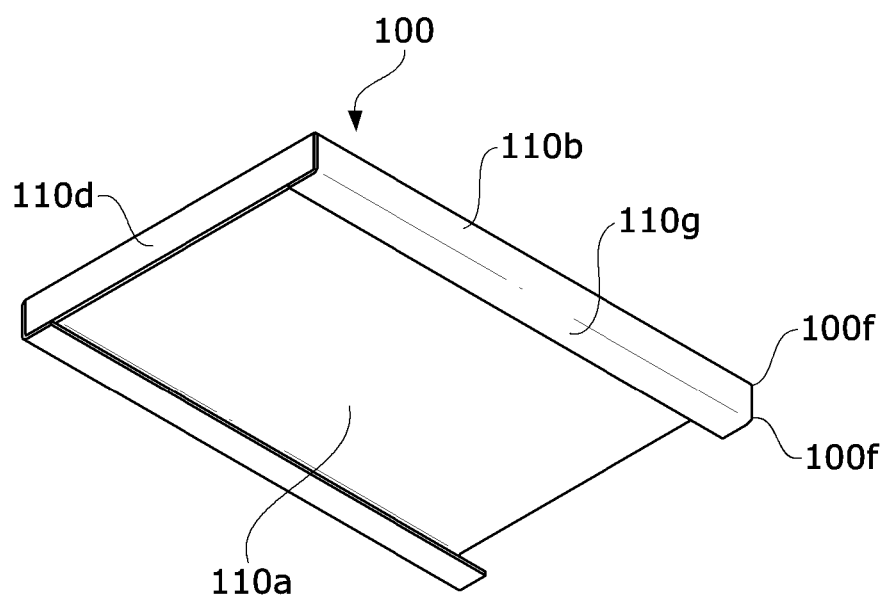
FIG. 1 is a diagram illustrating a display panel according to one aspect of the present disclosure.

Various aspects and features of the disclosure and methods of accomplishing them may be understood more readily by reference to the following detailed descriptions of exemplary aspects and the accompanying drawings. The disclosure may, however, be embodied in many different forms and should not be construed as being limited to the exemplary aspects set forth herein. Rather, these exemplary aspects are provided so that this disclosure will be thorough and complete and will fully convey the concept of the disclosure to those skilled in the art, and the disclosure is defined by the appended claims.

The shapes, sizes, proportions, angles, numbers, etc. shown in the figures to describe the exemplary aspects of the disclosure are merely examples and not limited to those shown in the figures. Like reference numerals denote like elements throughout the specification. In describing the disclosure, detailed descriptions of related well-known technologies will be omitted to avoid unnecessary obscuring the disclosure.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. The terms and names of elements used herein are chosen for ease of description and may be different from the names of parts used in actual products.

Like reference numerals designate like elements throughout the description.

The features of various exemplary aspects of the present disclosure may be coupled or combined with one another either partly or wholly, and may technically interact or work together in various ways. The exemplary aspects may be carried out independently or in connection with one another Hereinafter, a "bending part" refers to a part that is bent in a display panel. The bending part may be a configuration that is bent in, for example, a flexible display panel, may be a configuration that is bent to place a drive IC on a rear surface of a display device, or may be a configuration that is bent to implement a multi-display. The bending part is not limited to these configurations.

Hereinafter, various aspects will be described in detail with reference to the accompanying drawings.

FIG. 1 is a diagram illustrating a display panel according to one aspect of the present disclosure.

The display panel according to one aspect is manufactured based on a glass film substrate that is bendable. The glass film substrate may be a glass film having a thickness of 0.2 mm or less. A commercially available reinforced glass film may be used as the glass film. Hereinafter, a glass substrate may be interpreted as a glass film substrate.

As shown in FIG. 1, the display panel 100 has a width in the X-axis direction, a length in the Y-axis direction, and a thickness in the Z-axis direction. Since a circuit layer and a light-emitting element layer may be disposed on the glass substrate, the thickness of the display panel 100 is greater than that of the glass substrate. The width and length of the display panel 100 may be set to various design values depending on application fields of the display device. The display panel 100 may be manufactured in the shape of a substantially rectangular plate as shown in FIG. 1, but is not limited thereto. For example, the display panel 100 may be manufactured as a panel of another shape including a curved portion.

In one aspect, the display panel 100 may include displays 110a and 110b for reproducing an input image, drivers 110d and 110g, and a boundary region 100b disposed therebetween. The displays 110a and 110b may have different sizes. The boundary region 100b may be formed as a line extending from one end of the display panel to the other end in the length direction Y or the width direction X. The boundary region 100b may include a bending part through which the display panel is bent, or may be included in the bending part. Therefore, the display panel 100 may be bent or folded around the boundary region 100b by an external force. When the glass substrate of the display panel 100 is thin, it may be flexibly bent with a sufficiently large curvature even with a small force.

In one aspect, the display panel 100 may have the glass substrate divided into the displays 110a and 110b and the drivers 110d and 110g so as to be easily bent in the boundary region 100b, and may have an organic layer for forming the boundary region 110b. The organic layer may include a resin material having good elasticity, for example, one of polyimide, polyurethane, acrylic, and silicone synthetic rubber, or any combination thereof. As an example of silicone synthetic rubber, polydimethylsiloxane (PDMS) is possible.

Referring to FIG. 1, the displays 110a and 110b may include a pixel array displaying an image. Specifically, the displays 110a and 110b may include a first display 110a displaying main information, and a second display 110b displaying additional information. That is, the first display 110a may be a main display or a main display region, and the second display 110b may be a sub display or an auxiliary display region. The display panel 100 may include a plurality of second displays 110b. The second display 110b may be bent by about 90 degrees from the first display 110a to serve as a side display, but is not limited thereto.

The drivers 110d and 110g may include a region in which a data driver and a gate driver are mounted to drive pixels. Specifically, the drivers 110d and 110g may include the data driver 110d in which a drive IC is disposed to generate a data driving voltage, and the gate driver 110g in which a gate in panel (GIP) is disposed to generate a gate pulse. The display panel 100 may include a plurality of drivers 110d and 110g. In one aspect, a plurality of gate drivers 110g may be included.

The data driver 110d may be bent by 90 degrees from the first display 100a or be bent by 180 degrees to be positioned behind the first display 100a, but is not limited thereto.

The gate driver 110g may be bent by 90 degrees from the second display 100b or be bent by 180 degrees to be positioned behind the second display 100b, but is not limited thereto.

Figure 2:
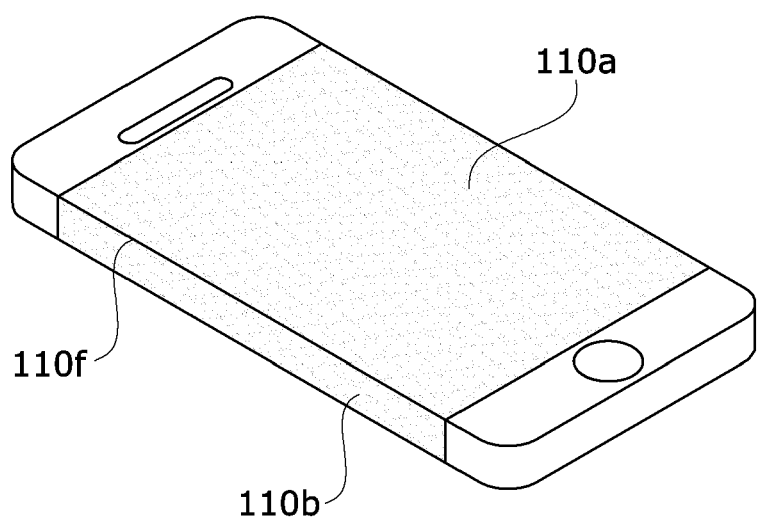
FIG. 2 is a diagram illustrating a display device according to one aspect of the present disclosure.

FIG. 2 is a diagram illustrating a display device according to one aspect of the present disclosure.

Referring to FIG. 2, the display device 10 may include the first display 110a, the second display 110b, and the bending part 100f. The first display 110a may be a main display on which main image information is displayed. The second display 110b may be a sub display on which additional information is displayed. The first display 110a may be formed on a front surface of the display device 10, and the second display 110b may be formed on a side surface of the display device 10. That is, the display device 10 according to one aspect of the present disclosure may be implemented as a multi-display by bending the display panel 100 around the bending part 100f. The second display 110b may also be disposed on a side surface opposite to the side surface shown in FIG. 2. That is, the display device 10 may include a plurality of second displays 110b. The display device 10 is not limited thereto, and may further include upper and lower sub displays as described later.

Hereinafter, a display panel according to one aspect of the present disclosure will be described in detail with reference to the accompanying drawings.

Figure 3:
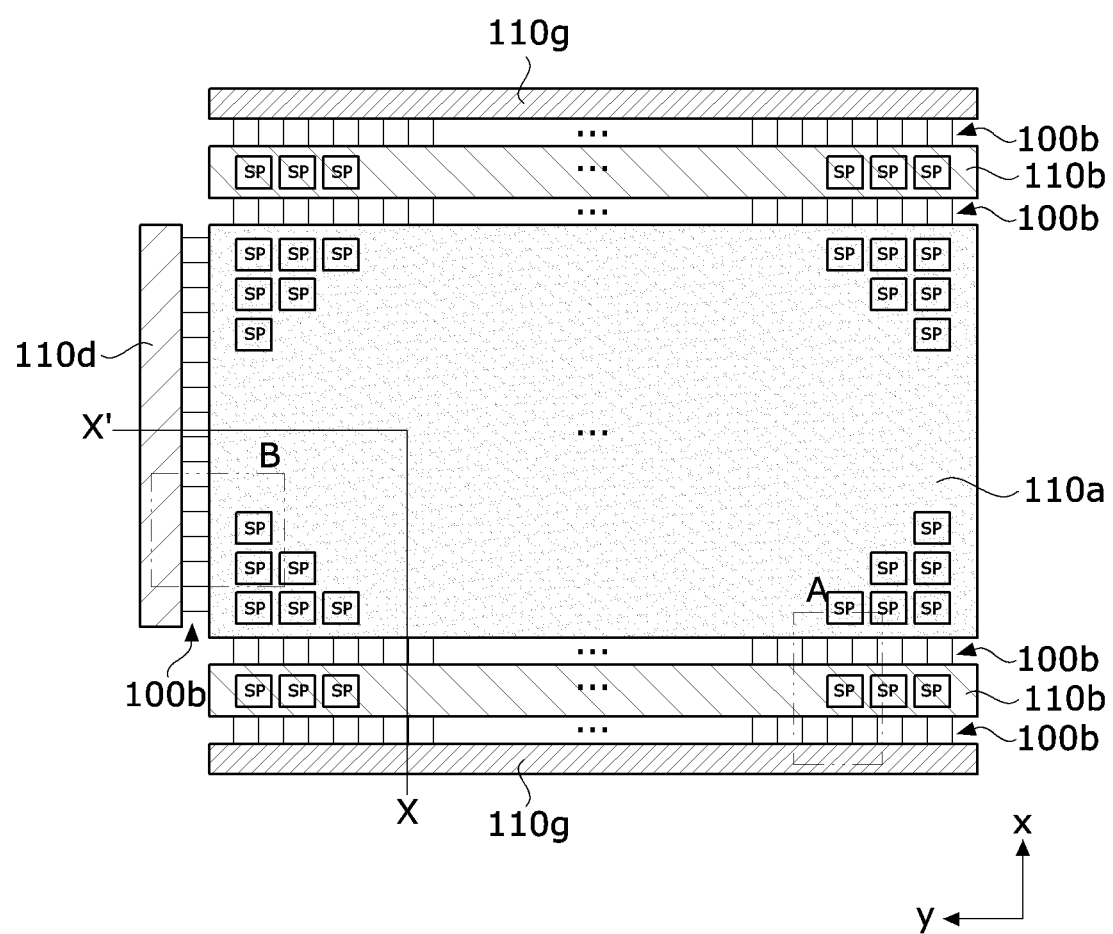
FIG. 3 is a diagram illustrating a display panel according to one aspect of the present disclosure.

FIG. 3 is a diagram illustrating a display panel according to one aspect of the present disclosure.

Referring to FIG. 3, the display panel 100 according to one aspect may include the first display 110a, the second display 110b, the data driver 110d, the gate driver 110g, and the boundary region 100b positioned therebetween.

That is, the first display 110a may be adjacent to the second display 110b with the boundary region 100b interposed therebetween. The second display 110b may be plural as shown, but is not limited thereto. The first display 110a may be a main display region in which main image information is displayed. The second display 110b may be a sub display region in which additional information is displayed. For example, the first display 110a may be a main display region located on the front surface, and the second display 110b may be a sub display region located on both side surfaces. The second display 110b may be bent at a predetermined angle toward the rear surface of the first display 110a around the boundary region 100b.

The first display 110a and the second display 110b may include gate lines arranged in a first direction (x-axis direction), and data lines arranged in a second direction (y-axis direction) crossing the first direction. Subpixels of the first and second displays 110a and 110b may be defined as points where the gate lines and the data lines cross each other.

The first display 110a may be adjacent to the data driver 110d with the boundary region 100b interposed therebetween. The data driver 110d may supply a data voltage of pixel data to the data lines. The second display 110b may be adjacent to the gate driver 110g with the boundary region 100b interposed therebetween. The gate driver 110g may include a gate driving circuit that sequentially supplies a gate pulse to the gate lines. The data driver 110d may be bent at a predetermined angle from the first display 110a around the boundary region 100b. The gate driver 110g may be bent at a predetermined angle toward the rear surface of the second display 110b around the boundary region 100b.

The arrangement of the data driver 110d and the gate driver 110g is not limited thereto. For example, the first display 110a and the gate driver 110g may be disposed adjacent to each other, and the second display 110b and the data driver 110d may be disposed adjacent to each other.

Figure 4:
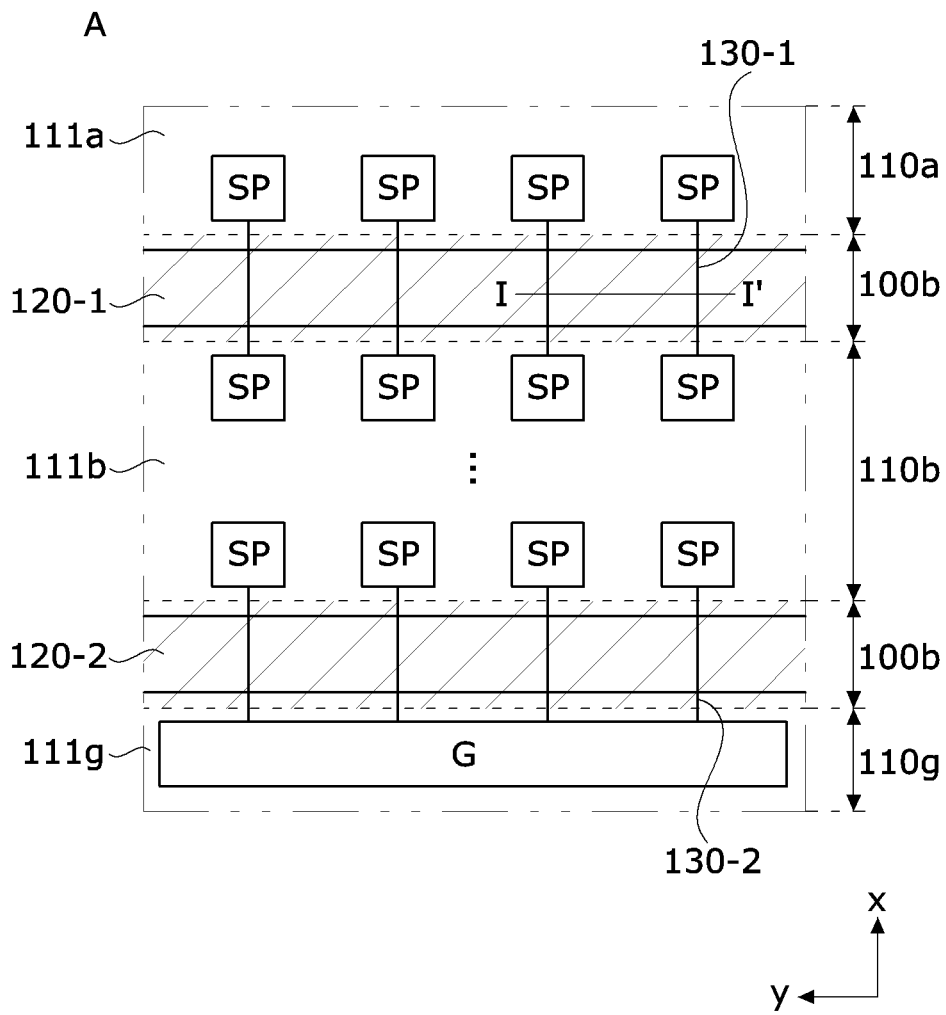
FIG. 4 is an enlarged diagram of region A in FIG. 3.

FIG. 4 is an enlarged diagram of a region A in FIG. 3.

Referring to FIG. 4, the first display 110a may include a first glass substrate 111a and subpixels SP disposed on the first glass substrate 111a. The second display 110b may include a second glass substrate 111b and subpixels SP disposed on the second glass substrate 111b. The gate driver 110g may include a gate glass substrate 111g and a gate driving circuit G disposed on the gate glass substrate 111g.

The first glass substrate 111a, the second glass substrate 111b, and the gate glass substrate 111g may be glass substrates separated from each other. The boundary region 100b between the respective glass substrates 111a, 111b, and 111g may include a region in which bending is made, that is, a bending part.

The first glass substrate 111a and the second glass substrate 111b spaced apart from each other may be disposed with a first organic layer 120-1 interposed therebetween. The first organic layer 120-1 may connect the first glass substrate 111a and the second glass substrate 111b spaced apart from each other. As described above, the first organic layer 120-1 may include a resin material having good elasticity, for example, one of polyimide, polyurethane, acrylic, and silicone synthetic rubber, or any combination thereof. As an example of silicone synthetic rubber, polydimethylsiloxane (PDMS) is possible. Therefore, the first organic layer 120-1 may facilitate bending between the first glass substrate 111a and the second glass substrate 111b around the boundary region 100b.

First wirings 130-1 may be disposed on the first organic layer 120-1. The first wirings 130-1 may connect the first display 110a and the second display 110b. Specifically, the first wirings 130-1 may connect the subpixels SP of the first display 110a and the subpixels SP of the second display 110b. The first wirings 130-1 may include the same material as that of the gate line of the pixel. Alternatively, the first wirings 130-1 may be wirings extended from the gate line of the pixel.

The second glass substrate 111b and the gate glass substrate 111g spaced apart from each other may be disposed with the second organic layer 120-2 interposed therebetween. The second organic layer 120-2 may connect the second glass substrate 111b and the gate glass substrate 111g spaced apart from each other. As described above, the second organic layer 120-2 may include a resin having good elasticity. Therefore, the second organic layer 120-2 may facilitate bending between the second glass substrate 111b and the gate glass substrate 111g around the boundary region 100b.

Second wirings 130-2 may be disposed on the second organic layer 120-2. The second wirings 130-2 may connect the second display 110b and the gate driver 110g. Specifically, the second wirings 130-2 may connect the subpixels SP of the second display 110b and the gate driving circuit G of the gate driver 110g. The second wirings 130-2 may include the same material as that of the gate line of the pixel. Alternatively, the second wirings 130-2 may be wirings extended from the gate line of the pixel.

Figure 5:
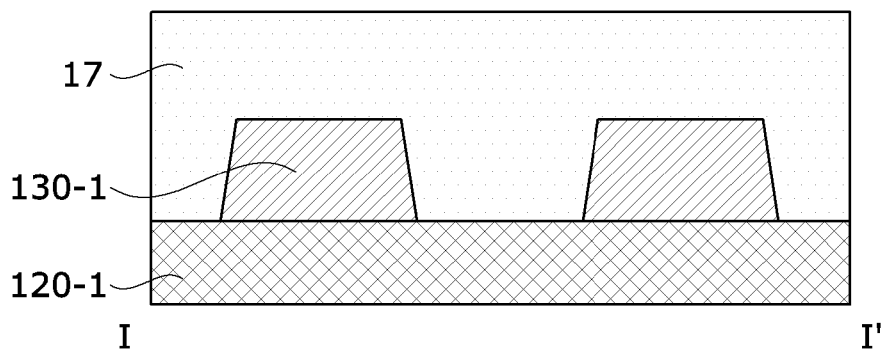
FIG. 5 is a cross-sectional diagram taken along line I-I' in FIG. 4.

FIG. 5 is a cross-sectional diagram taken along the line I-I' in FIG. 4, illustrating the first wirings and the boundary region.

Referring to FIG. 5, the first wirings 130-1 may be disposed on the first organic layer 120-1 including an organic material. In addition, the first wirings 130-1 may be insulated by an insulating layer 17. That is, the insulating layer 17 may be disposed on the first organic layer 120-1 to cover the first wirings 130-1. As described above, the display panel 100 may be bent at a predetermined angle around the boundary region. Therefore, the boundary region may be implemented with an organic layer including an organic material that is easy to bend. This is because an inorganic film is not suitable for bending due to cracks that are easily caused during bending.

Since the first display 110a and the second display 110b form about 90 degrees, the first wirings 130-1 connecting the first and second displays 110a and 110b may have a straight line pattern. However, as will be described later, a zig-zag pattern or a ring pattern may also be available. In this case, even if bending is made at a large angle, disconnection may not occur. Although FIG. 5 exemplarily shows the first wirings 130-1 for convenience of description, this may be applied to other wirings disposed in the boundary region 100b.

Figure 6:
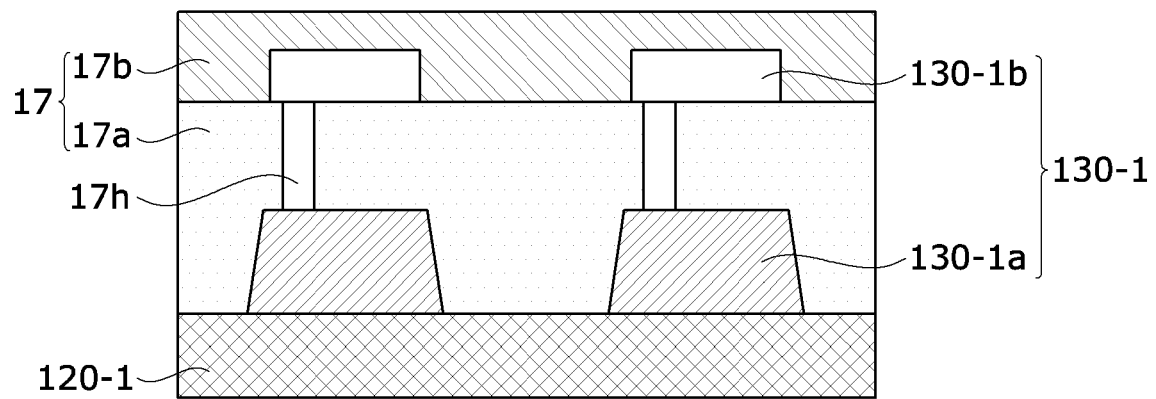
FIG. 6 is a diagram illustrating a modified example of wirings in FIG. 5.

FIG. 6 is a diagram illustrating a modified example of wirings in FIG. 5.

Referring to FIG. 6, each of the first wirings 130-1 according to one aspect of the present disclosure may include a first main wiring 130-1a and a first auxiliary wiring 130-1b. The first auxiliary wiring 130-1b may be an auxiliary wiring connected in parallel to the first main wiring 130-1a. Connecting the first auxiliary wiring 130-1b in parallel to the first main wiring 130-1a may make it possible to reduce the resistance of the wiring.

The resistance of the wiring is defined by Equation 1 below.

$$R = \rho \frac{L}{A} \quad \text{[Equation 1]}$$

Here, ρ is the resistivity of a material constituting the wiring, A is the area of a cross section of the wiring, and L is the length of the wiring. Referring to Equation 1, the resistance of the wiring is proportional to the length (L) of the wiring, and inversely proportional to the cross-sectional area (A) of the wiring. When this is applied to the aspect, the auxiliary wirings connected in parallel to the first wirings 130-1 may serve to increase the cross-sectional area (A) of each of the first wirings 130-1. That is, when the first auxiliary wiring 130-1b is connected in parallel to the first main wiring 130-1a, the resistance (R) may be lowered by the increased cross-sectional area (A) of the wiring in comparison with a case where only the first main wiring 130-1a exists.

In addition, even if the first main wiring 130-1a or the first auxiliary wiring 130-1b is disconnected, a parallel connection structure of the first wirings 130-1 enables signal transmission through the remaining wiring that is not disconnected. As a result, the stability of the display device can be improved. That is, if the wiring is disconnected in case where there is no wiring connected in parallel to the first main wiring 130-1a, it is not possible to transmit a current to the pixel connected to the disconnected wiring. However, in case where the first auxiliary wiring 130-1b is connected in parallel to the first main wiring 130-1a, a current may flow even if one of the two wirings is disconnected. Therefore, this has the advantage of improving the stability of the display device.

The first main wiring 130-1a may be disposed on the first organic layer 120-1 including an organic material. In addition, a first insulating layer 17a may be disposed on the first main wiring 130-1a. The first auxiliary wiring 130-1b may be disposed on the first insulating layer 17a. A second insulating layer 17b may be disposed on the first auxiliary wiring 130-1b.

The first auxiliary wiring 130-1b may include the same material as that of a first electrode of a light emitting device. Specifically, the light emitting device may include the first electrode, a second electrode, and an organic compound layer disposed between the first and second electrodes, and the first auxiliary wiring 130-1b may contain the same material as that of the first electrode of the light emitting device. In the light emitting device, the first electrode may be an anode electrode (AND), and the second electrode may be a cathode electrode (CAT). Alternatively, the first electrode may be the cathode electrode (CAT), and the second electrode may be the anode electrode (AND). In addition, the first auxiliary wiring 130-1b may include the same material as that of the second electrode. The first electrode, the second electrode, and the organic compound layer will be described later with reference to FIG. 23.

The first insulating layer 17a may include a contact hole 17h penetrating the first insulating layer 17a. The first auxiliary wiring 130-1b may be connected to the first main wiring 130-1a through the contact hole 17h formed in the first insulating layer 17a. For example, the contact hole 17h may be formed in each of a boundary region adjacent to the first display 110a and a boundary region adjacent to the second display 110b. The first main wiring 130-1a and the first auxiliary wiring 130-1b may be connected at two points or more through the contact hole 17h. This is because in order to connect the first main wiring 130-1a and the first auxiliary wiring 130-1b in parallel, contacts should be made at two points or more.

Although FIG. 6 exemplarily shows the first wirings 130-1 for convenience of description, this may be applied to other wirings disposed in the boundary region 100b.

Figure 7:
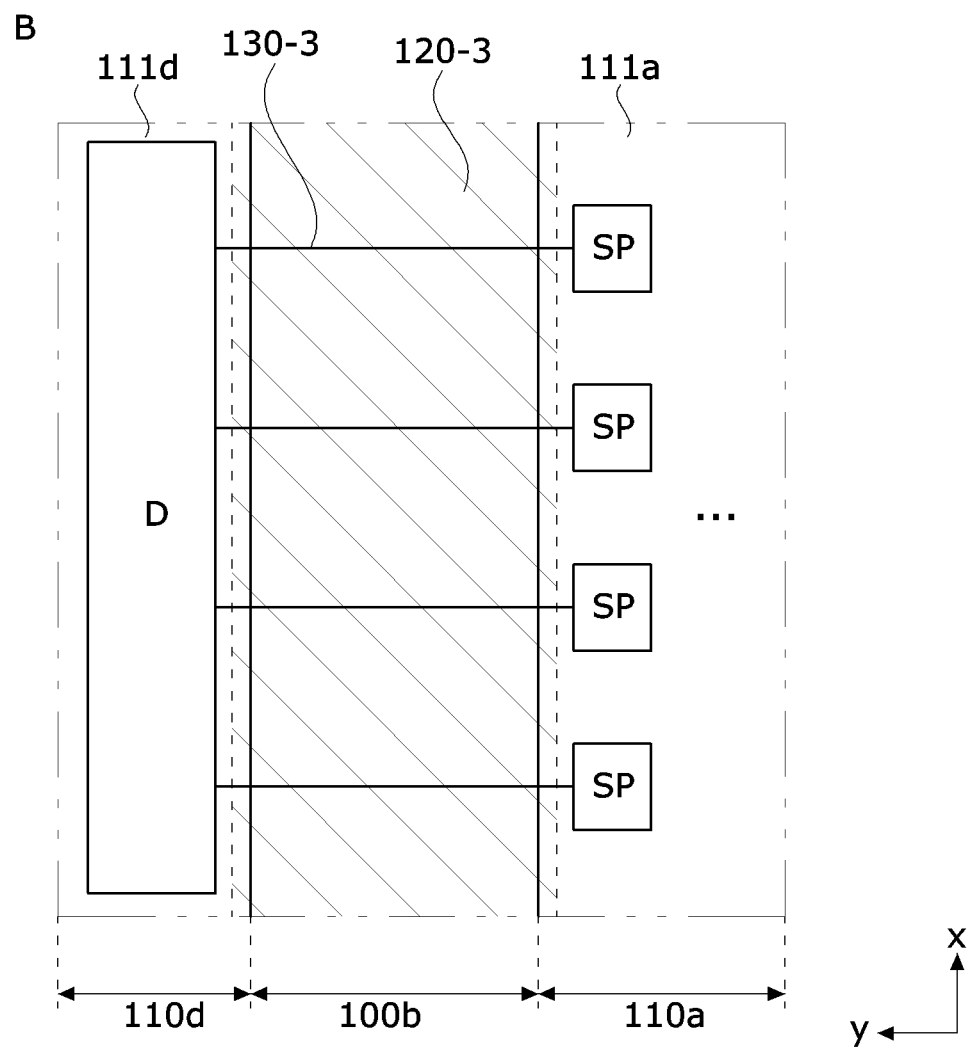
FIG. 7 is an enlarged diagram of region B in FIG. 3.

FIG. 7 is an enlarged diagram of a region B in FIG. 3.

Referring to FIG. 7, the first display 110a may include a first glass substrate 111a and subpixels SP disposed on the first glass substrate 111a. The data driver 110d may include a data glass substrate 111d and a data driving circuit D disposed on the data glass substrate 111d.

The first glass substrate 111a and the data glass substrate 111d may be glass substrates separated from each other. That is, the first glass substrate 111a, the second glass substrate 111b, the data glass substrate 111d, and the gate glass substrate 111g may be glass substrates separated from each other. The boundary region 100b between the first glass substrate 111a and the data glass substrate 111d may include a region in which bending is made, that is, a bending part.

The first glass substrate 111a and the data glass substrate 111d spaced apart from each other may be disposed with a third organic layer 120-3 interposed therebetween. The third organic layer 120-3 may connect the first glass substrate 111a and the data glass substrate 111d spaced apart from each other. As described above, the third organic layer 120-3 may include a resin having good elasticity. Therefore, the third organic layer 120-3 may facilitate bending between the first glass substrate 111a and the data glass substrate 111d around the boundary region 100b.

Third wirings 130-3 may be disposed on the third organic layer 120-3. The third wirings 130-3 may connect the first display 110a and the data driver 110d. Specifically, the third wirings 130-3 may connect the subpixels SP of the first display 110a and the data driving circuit D of the data driver 110d. The third wirings 130-3 may include the same material as that of the data line of the pixel. Alternatively, the third wirings 130-3 may be wirings extended from the data line of the pixel.

Figure 8:
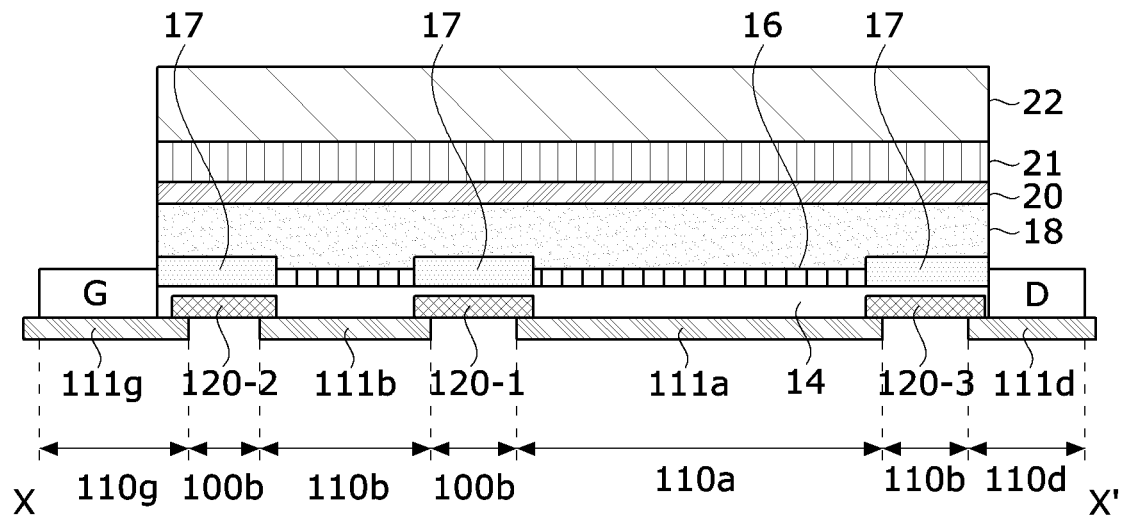
FIG. 8 is a cross-sectional diagram taken along line X-X' in FIG. 3.

FIG. 8 is a cross-sectional diagram taken along the line X-X' in FIG. 3.

Referring to FIG. 8, the configuration of the display panel 100 according to one aspect of the present disclosure will be described in detail.

The display panel 100 may include the first display 110a, the second display 110b, the data driver 110d, and the gate driver 110g, which are positioned with the boundary region 100b interposed therebetween.

The first display 110a may include the first glass substrate 111a and further include a circuit layer 14 and a light-emitting element layer 16 both disposed on the first glass substrate 111a. The first display 110a may further include an encapsulation layer 18, a polarizing plate 20, and a cover window 22, which cover the circuit layer 14 and the light-emitting element layer 16.

The second display 110b may include the second glass substrate 111b and further include the circuit layer 14 and the light-emitting element layer 16 both disposed on the second glass substrate 111b. The second display 110b may further include the encapsulation layer 18, the polarizing plate 20, and the cover window 22, which cover the circuit layer 14 and the light-emitting element layer 16.

In the display panel 100, a touch screen in which touch sensors are arranged may be implemented. Although not shown in the drawing, wirings of the touch sensors may be disposed between the encapsulation layer 18 and the polarizing plate 20.

The gate driver 110g may include the gate glass substrate 111g and the gate driving circuit G disposed on the gate glass substrate 111g. The data driver 110d may include the data glass substrate 111d and the data driving circuit D disposed on the data glass substrate 111d.

The first organic layer 120-1 may be disposed in the boundary region 100b between the first glass substrate 111a and the second glass substrate 111b. The first organic layer 120-1 may connect the first glass substrate 111a and the second glass substrate 111b. In addition, the first organic layer 120-1 may facilitate bending of the display panel 100. The first wirings (not shown) may be disposed on the first organic layer 120-1 to connect the subpixels of the first display 110a and the subpixels of the second display 110b. The insulating layer 17 may be disposed on the first organic layer 120-1 on which the first wirings are disposed.

The second organic layer 120-2 may be disposed in the boundary region 100b between the second glass substrate 111b and the gate glass substrate 111g. The second organic layer 120-2 may connect the second glass substrate 111b and the gate glass substrate 111g. In addition, the second organic layer 120-2 may facilitate bending of the display panel 100. The second wirings (not shown) may be disposed on the second organic layer 120-2 to connect the second display 110b and the gate driver 110g. The insulating layer 17 may be disposed on the second organic layer 120-2 on which the second wirings are disposed.

The third organic layer 120-3 may be disposed in the boundary region 100b between the first glass substrate 111a and the data glass substrate 111d. The third organic layer 120-3 may connect the first glass substrate 111a and the data glass substrate 111d. In addition, the third organic layer 120-3 may facilitate bending of the display panel 100. The third wirings (not shown) may be disposed on the third organic layer 120-3 to connect the first display 110a and the data driver 110d. The insulating layer 17 may be disposed on the third organic layer 120-3 on which the third wirings are disposed.

Figure 9A:
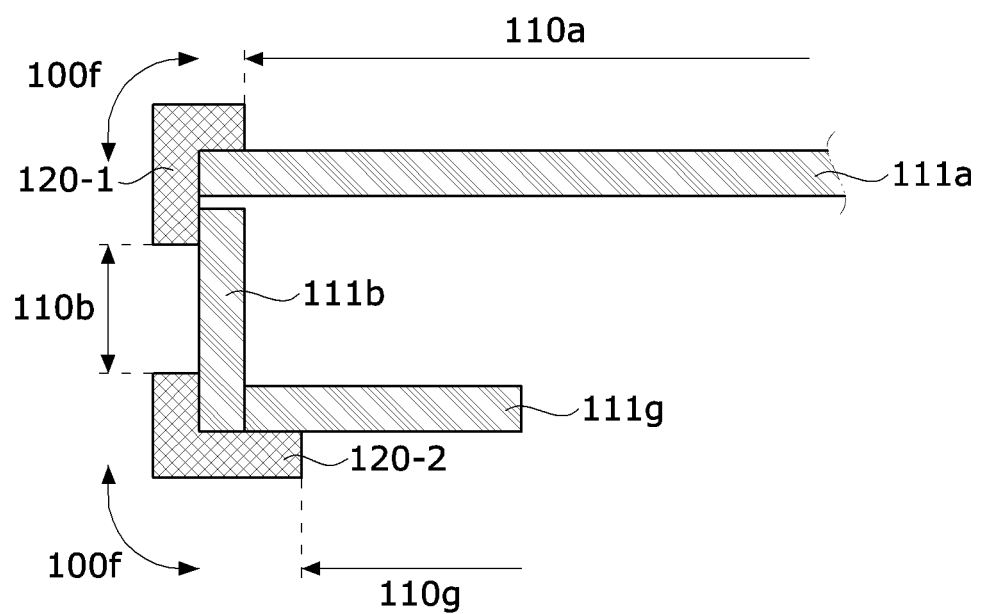
FIGS. 9A and 9B are diagrams illustrating a glass substrate.
Figure 9B:
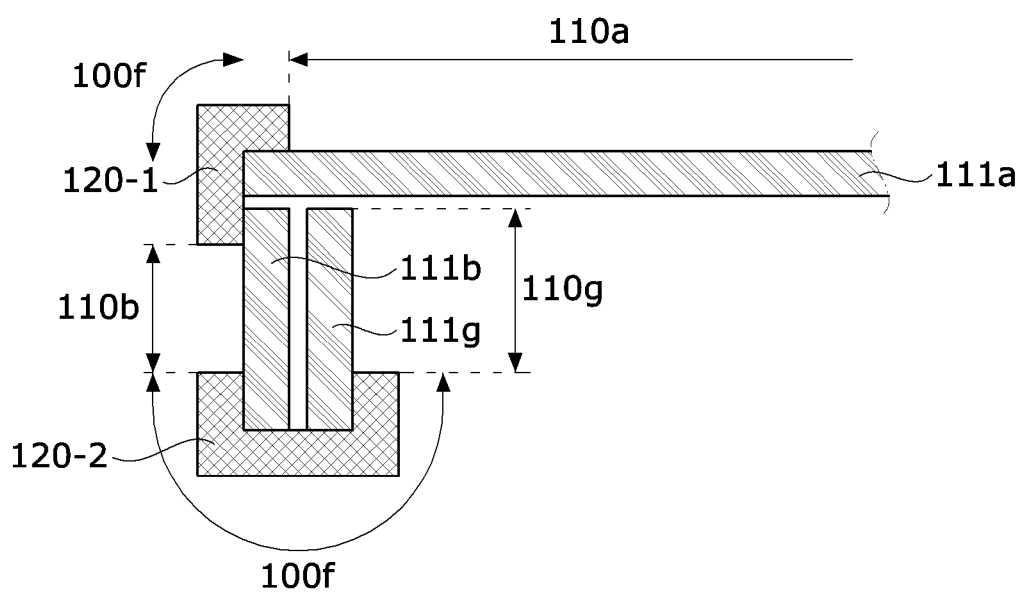

FIGS. 9A and 9B are diagrams illustrating a glass substrate.

Referring to FIG. 9A as one aspect, the first glass substrate 111a and the second glass substrate 111b may form about 90 degrees. That is, the bending part 100f between the first glass substrate 111a and the second glass substrate 111b may be bent at an angle of about 90 degrees.

The second glass substrate 111b and the gate glass substrate 111g may form about 90 degrees. That is, the bending part 100f between the second glass substrate 111b and the gate glass substrate 111g may be bent at an angle of about 90 degrees.

Referring to FIG. 9B as another aspect, the first glass substrate 111a and the second glass substrate 111b may form about 90 degrees. That is, the bending part 100f between the first glass substrate 111a and the second glass substrate 111b may be bent at an angle of about 90 degrees.

The second glass substrate 111b and the gate glass substrate 111g may form about 180 degrees. That is, the bending part 100f between the second glass substrate 111b and the gate glass substrate 111g may be bent at an angle of about 180 degrees.

The bending angle of the bending part 100f is not limited to the above angles. For example, the first glass substrate 111a and the second glass substrate 111b may have an angle ranging from 0 to 90 degrees, and the second glass substrate 111b and the gate glass substrate 111g may have an angle ranging from 90 to 180 degrees.

This can also be applied to an angle between the first glass substrate 111a and the data glass substrate 111d. That is, the first glass substrate 111a and the data glass substrate 111d may have an angle ranging from about 90 to 180 degrees, but this is not a limitation.

Figure 10:
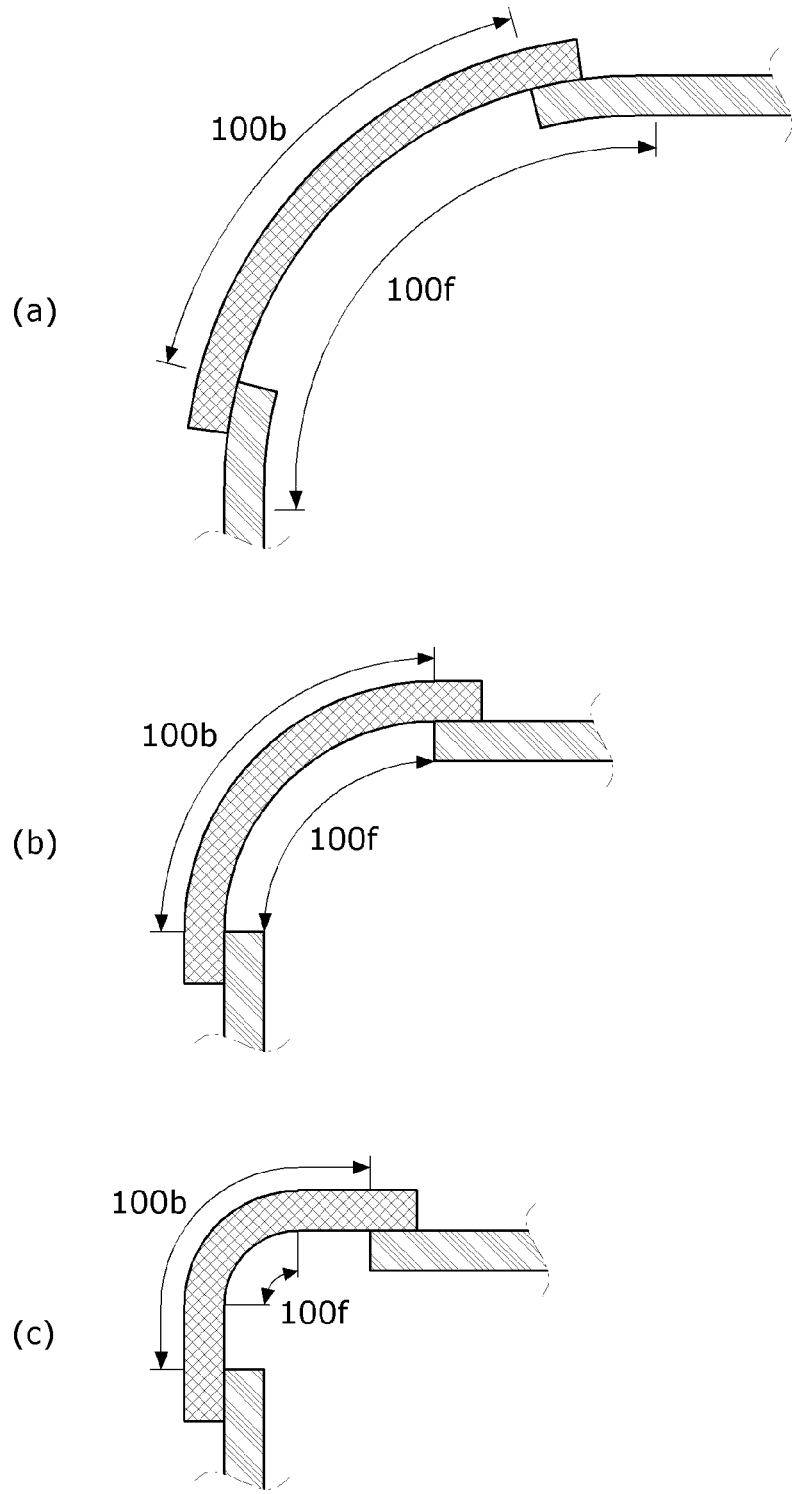
FIG. 10 is a diagram illustrating a relationship between a bending part and a boundary region in a display panel.

FIG. 10 is a diagram illustrating a relationship between a bending part and a boundary region in a display panel. In aspects of the present disclosure, the bending part and the boundary region may have relationships of (a) to (c).

Referring to (a) of FIG. 10, the bending part 100f of the display panel 100 may include the boundary region 100b. In this case, the bending part 100f includes even an edge portion of the glass substrate. Therefore, the bending part 100f may be wider than the boundary region 100b, that is, a region between the glass substrates. That is, a portion where bending occurs may be not only the boundary region 100b but also a part of the edge portion of the glass substrate.

Referring to (b) of FIG. 10, the bending part 100f of the display panel 100 may coincide with the boundary region 100b. That is, a portion where bending occurs may be substantially the same as the boundary region 100b.

Referring to (c) of FIG. 10, the boundary region 100b of the display panel 100 may include the bending part 100f. In this case, the bending part 100f includes only a portion of the boundary region 100b. Therefore, the boundary region 100b, that is, a region between the glass substrates may be wider than the bending part 100f. That is, a portion where bending occurs may be a part of the boundary region 100b.

Figure 11:
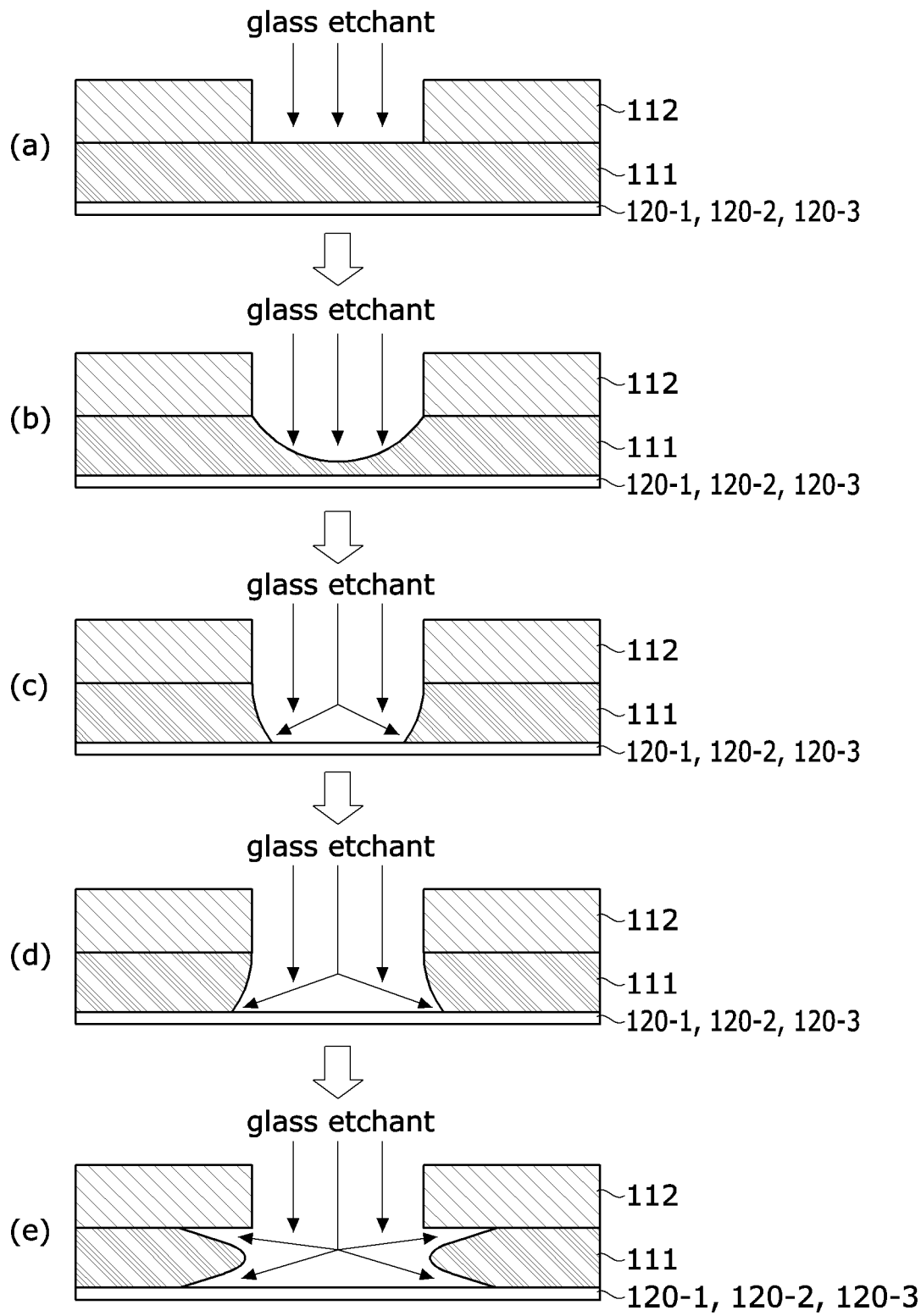
FIG. 11 is a diagram illustrating a process of manufacturing a glass substrate according to one aspect of the present disclosure.

FIG. 11 is a diagram illustrating a process of manufacturing a glass substrate according to one aspect of the present disclosure.

Referring to FIG. 11, the glass substrate may be formed by partially etching a mother glass substrate 111 from a rear surface thereof. A mask 112 may be disposed on one surface of the mother glass substrate 111, and an etch prevention layer 120-1, 120-2 or 120-3 may be disposed on the other surface of the mother glass substrate 111. A circuit layer and an organic emission layer are disposed on the etch prevention layer 120-1, 120-2 or 120-3, but they are omitted for convenience of illustration. The mask 112 and the etch prevention layer 120-1, 120-2 or 120-3 may be organic layers applied or adhered to the mother glass substrate 111. The etch prevention layer 120-1, 120-2 or 120-3 serves as an etch stopper in an etching process, and may be the first to third organic layers 120-1, 120-2 and 120 in the above-described aspect. The mask 112 may have an opening for exposing the glass to etchant. The shape, thickness, and spacing of a glass pattern may be determined depending on the shape and spacing of the opening and an etching process time. The mask 112 may be removed after the etching process.

In the present disclosure, the mother glass substrate 111 may be etched by spraying the etchant onto the mother glass substrate 111 to which the mask 112 is bonded, or by dipping the mother glass substrate 111 into a water tank containing the etchant.

The glass etchant is supplied to the mother glass substrate 111 through the opening of the mask 112. The mother glass substrate 111 exposed to the opening of the mask 112 as shown in (a) of FIG. 11 starts to be etched in response to the glass etchant. A recess is formed in the mother glass substrate 111 as shown in (b) of FIG. 11 while the glass exposed to the etchant is etched, and the depth of the recess becomes increasing as shown in (c) of FIG. 11 as the etching process time elapses. If the etching process time is longer in the etching process, a tapered surface may be formed on glass sidewalls in the recess as shown in (d) and (e) of FIG. 11 by the etchant penetrating between the mother glass substrate 111 and the etch prevention layer 120-1, 120-2 or 120-3 and between the mother glass substrate 111 and the mask 112. Therefore, if necessary, it is possible to form such a tapered surface the sidewall of the glass substrate.

Figure 12:
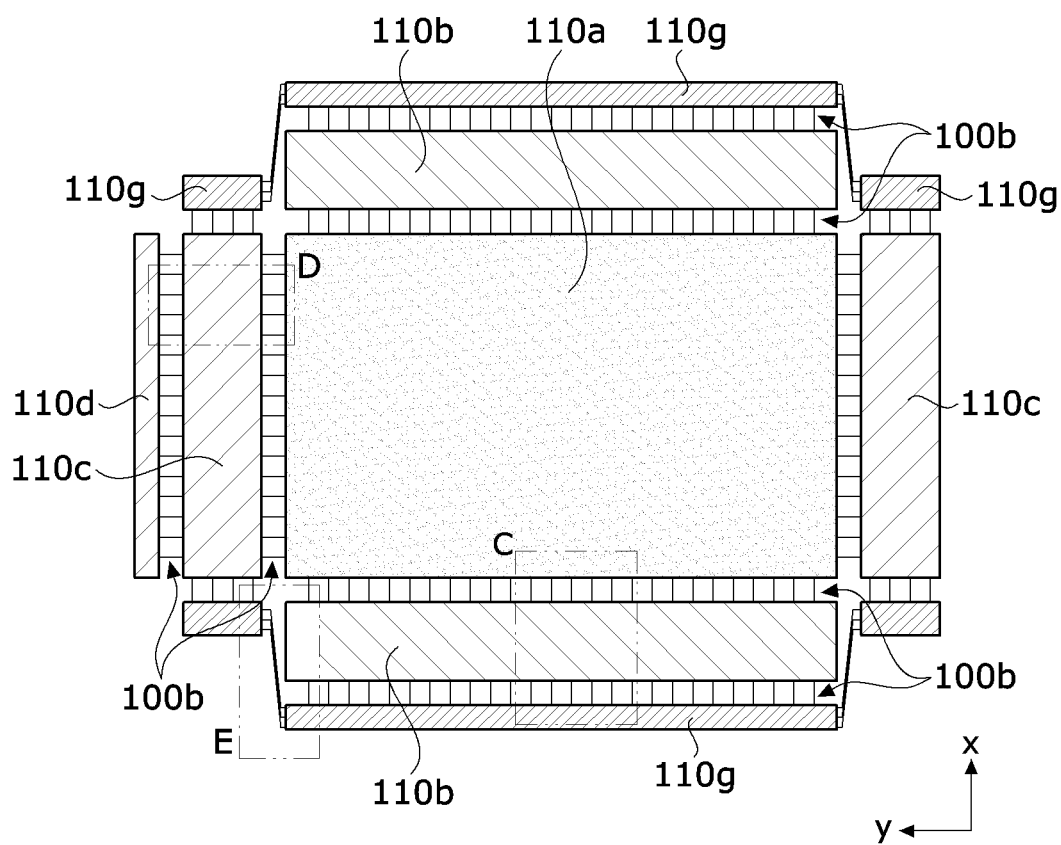
FIG. 12 is a diagram illustrating a display panel according to another aspect of the present disclosure.

FIG. 12 is a diagram illustrating a display panel according to another aspect of the present disclosure. Hereinafter, a description will be made focusing on differences compared to the aspect of FIG. 3.

Referring to FIG. 12, the display panel 100 according to the aspect may include the first display 110a, the second display 110b, a third display 110c, the data driver 110d, the gate driver 110g, and the boundary region 100b positioned therebetween.

That is, the first display 110a may be adjacent to the second display 110b with the boundary region 100b interposed therebetween. In addition, the first display 110a may be adjacent to the third display 110c with the boundary region 100b interposed therebetween. The second display 110b and the third display 110c may be plural as shown, but this is not a limitation. The first display 110a may be a main display region in which main image information is displayed. The second display 110b and the third display 110c may be sub display regions in which additional information is displayed. For example, the first display 110a may be a main display region located on the front, the second display 110b may be sub display regions located on both lateral sides, and the third display 110c may be sub display regions located on upper and lower sides.

The second display 110b may be bent at a predetermined angle toward the rear surface of the first display 110a around the boundary region 100b. The third display 110c may be bent at a predetermined angle toward the rear surface of the first display 110a around the boundary region 100b.

The first display 110a, the second display 110b, and the third display 110c may include gate lines arranged in the first direction (x-axis direction), and data lines arranged in the second direction (y-axis direction) crossing the first direction. Subpixels of the first, second, and third displays 110a, 110b, and 110c may be defined as points where the gate lines and the data lines cross each other.

The second display 110b may be adjacent to the gate driver 110g with the boundary region 100b interposed therebetween. The gate driver 110g may include a gate driving circuit that sequentially supplies a gate pulse to the gate lines. The gate driver 110g may be bent at a predetermined angle from the second display 110b around the boundary region 100b.

The third display 110c may be adjacent to the data driver 110d with the boundary region 100b interposed therebetween. In addition, the third display 110c may be adjacent to the gate driver 110g with the boundary region 100b interposed therebetween. A surface of the third display 110c adjacent to the gate driver 100g may be different from a surface adjacent to the data driver 100d. The data driver 110d may supply a data voltage of pixel data to the data lines. The data driver 110d and the gate driver 110g may be bent at a predetermined angle toward the rear surface of the third display 110c around the boundary region 100b.

The arrangement of the first to third displays 110a, 110b, and 110c, the data driver 110d, and the gate driver 110g is not limited to the above.

Figure 13:
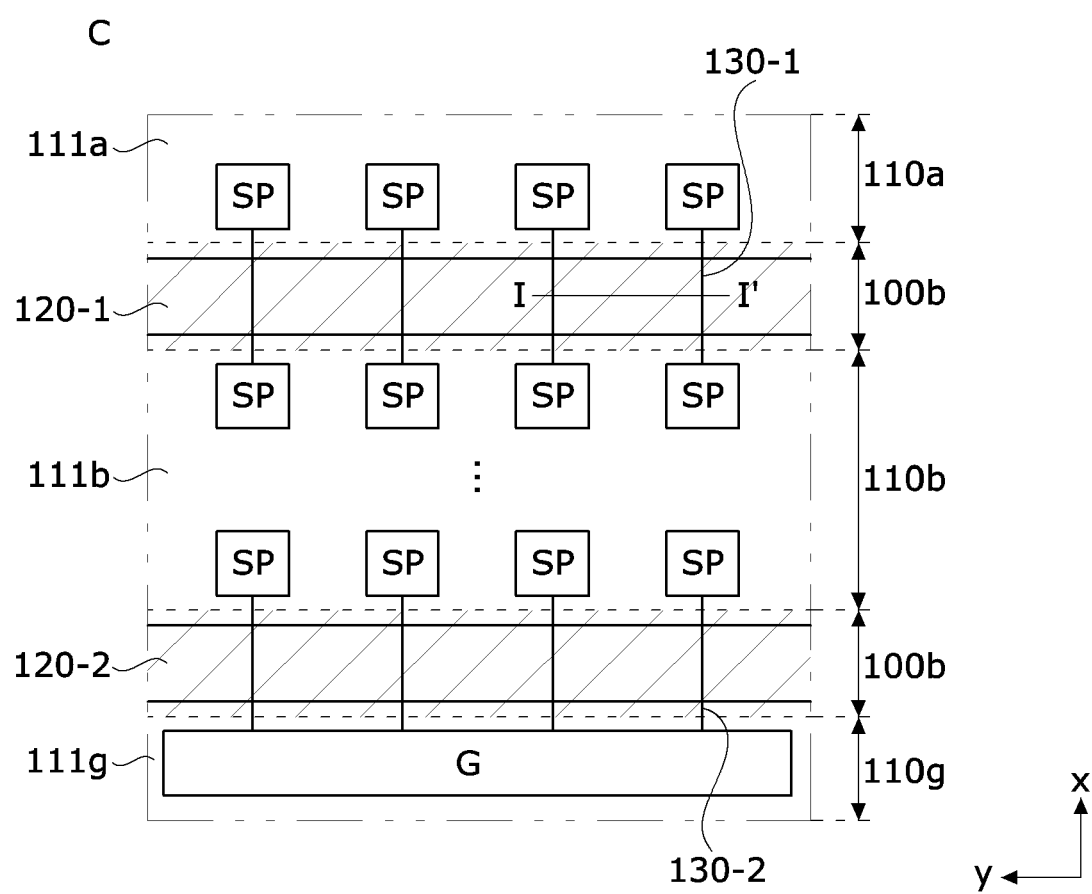
FIG. 13 is an enlarged view of a region C in FIG. 12.

FIG. 13 is an enlarged view of a region C in FIG. 12.

Referring to FIG. 13, the first display 110a may include the first glass substrate 111a and subpixels SP disposed on the first glass substrate 111a. The second display 110b may include the second glass substrate 111b and subpixels SP disposed on the second glass substrate 111b. The gate driver 110g may include the gate glass substrate 111g and the gate driving circuit G disposed on the gate glass substrate 111g. Since the other is substantially the same as described above with reference to FIG. 4, redundant descriptions are omitted.

Figure 14:
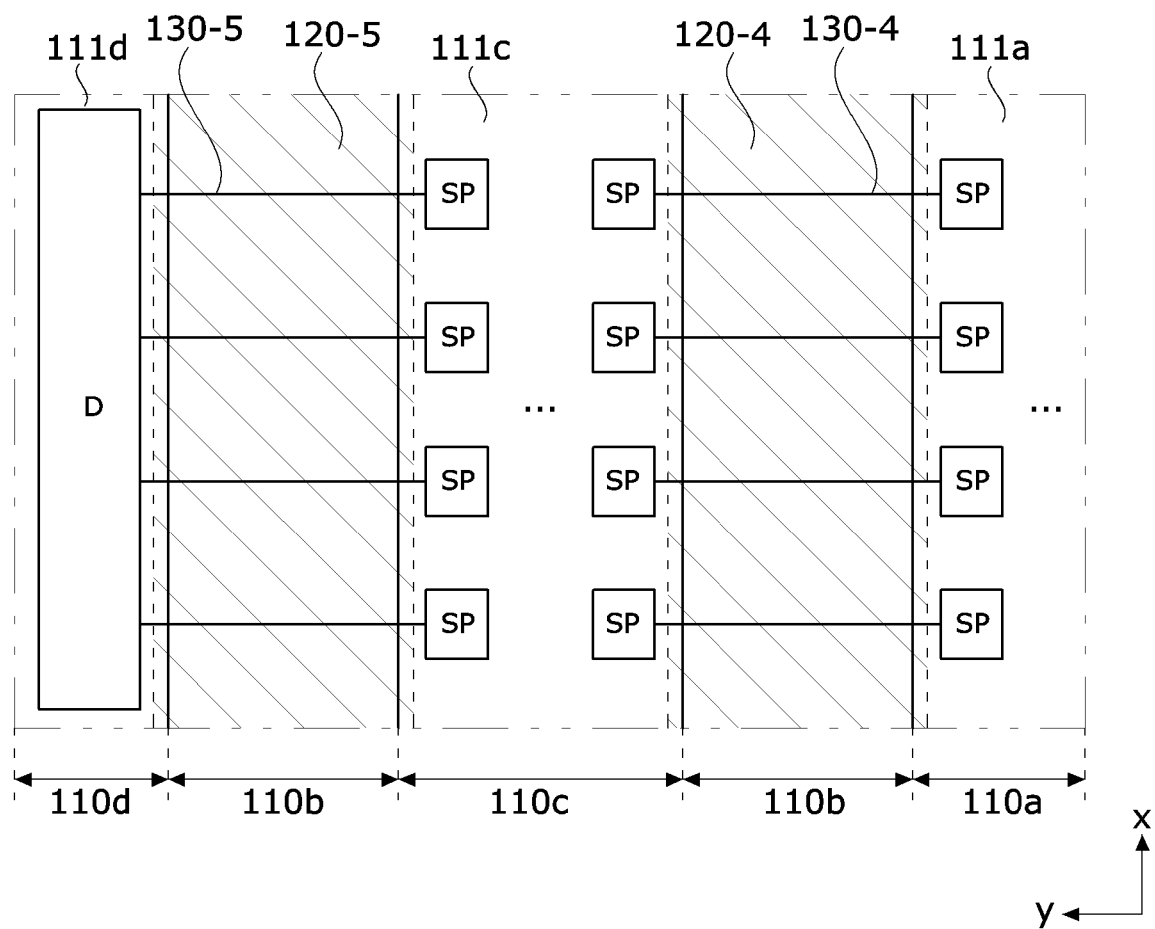
FIG. 14 is an enlarged view of a region D in FIG. 12.

FIG. 14 is an enlarged view of a region D in FIG. 12.

Referring to FIG. 14, the first display 110a may include the first glass substrate 111a and subpixels SP disposed on the first glass substrate 111a. The third display 110c may include a third glass substrate 111c and subpixels SP disposed on the third glass substrate 111c. The data driver 110d may include the data glass substrate 111d and the data driving circuit G disposed on the data glass substrate 111d. In a plan view, the first display 110a may be adjacent to the third display 110c in the second direction (y-axis direction), and the data driver 110d may be adjacent to the third display 110c in the second direction. That is, in a plan view, the first display 110a and the data driver 110d may be disposed with the third display 110c interposed therebetween.

The first glass substrate 111a, the third glass substrate 111c, and the data glass substrate 111d may be glass substrates separated from each other. That is, the first glass substrate 111a, the second glass substrate 111b, the third glass substrate 111c, the data glass substrate 111d, and the gate glass substrate 111g may be glass substrates separated from each other. The boundary region 100b between the first glass substrate 111a and the third glass substrate 111c may include a region in which bending is made, that is, a bending part. In addition, the boundary region 100b between the third glass substrate 111c and the data glass substrate 111d may include a region in which bending is made, that is, a bending part.

The first glass substrate 111a and the third glass substrate 111c spaced apart from each other may be disposed with a fourth organic layer 120-4 interposed therebetween. The fourth organic layer 120-4 may connect the first glass substrate 111a and the third glass substrate 111c spaced apart from each other. As described above, the fourth organic layer 120-4 may include a resin material having good elasticity. Therefore, the fourth organic layer 120-4 may facilitate bending between the first glass substrate 111a and the third glass substrate 111c around the boundary region 100b.

Fourth wirings 130-4 may be disposed on the fourth organic layer 120-4. The fourth wirings 130-4 may connect the first display 110a and the third display 110c. Specifically, the fourth wirings 130-4 may connect the subpixels SP of the first display 110a and the subpixels SP of the third display 110c. The fourth wirings 130-4 may include the same material as that of the data line of the pixel. Alternatively, the fourth wirings 130-4 may be wirings extended from the data line of the pixel.

The third glass substrate 111c and the data glass substrate 111d spaced apart from each other may be disposed with a fifth organic layer 120-5 interposed therebetween. The fifth organic layer 120-5 may connect the third glass substrate 111c and the data glass substrate 111d spaced apart from each other. As described above, the fifth organic layer 120-5 may include a resin having good elasticity. Therefore, the fifth organic layer 120-5 may facilitate bending between the third glass substrate 111c and the data glass substrate 111d around the boundary region 100b.

Fifth wirings 130-5 may be disposed on the fifth organic layer 120-5. The fifth wirings 130-5 may connect the third display 110c and the data driver 110d. Specifically, the fifth wirings 130-5 may connect the subpixels SP of the third display 110c and the data driving circuit D of the data driver 110d. The fifth wirings 130-5 may include the same material as that of the data line of the pixel. Alternatively, the fifth wirings 130-5 may be wirings extended from the data line of the pixel.

Figure 15:
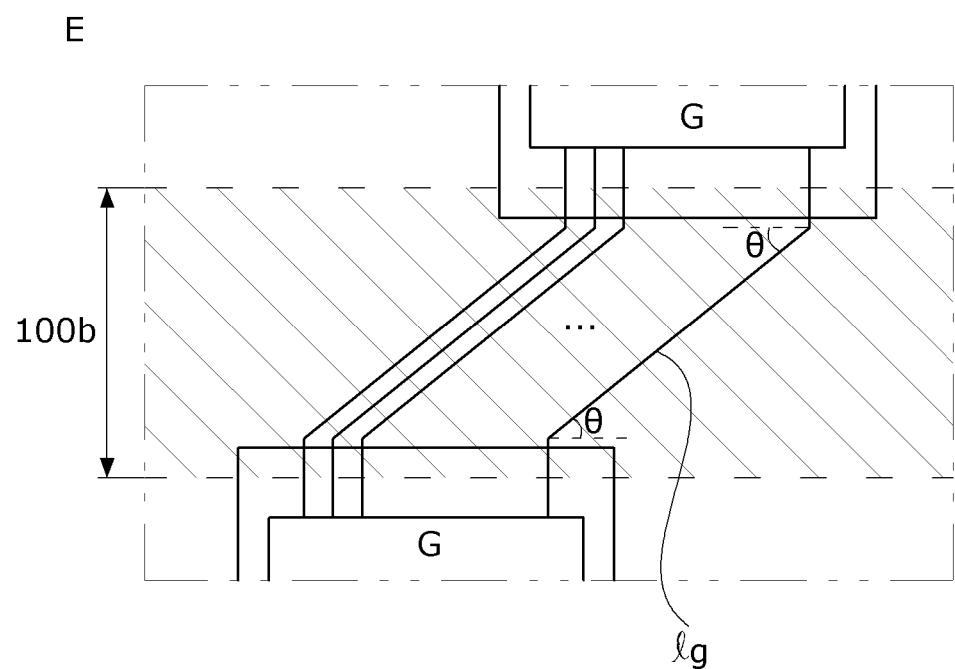
FIG. 15 is an enlarged view of a region E in FIG. 12.

FIG. 15 is an enlarged view of a region E in FIG. 12.

Referring to FIG. 15, the display panel 100 further includes connection wirings (1g) disposed in the boundary region 100b between the second display 110b and the third display 110c. The connection wires (1g) may connect the neighboring gate drivers 110g. For example, as shown in the region E of FIG. 12, it is possible to connect the gate driver 110g disposed on one side of the third display 110c and the gate driver 110g disposed on one side of the second display 110b.

The connection wirings (1g) may have bent portions. For example, two bent portions may be provided as shown in FIG. 15, but this is not a limitation. In case of including two bent portions, a bent angle (θ) may range from zero to 90 degrees based on a reference line (s). In one aspect, the bent angle (θ) may be, but is not limited to, 30 degrees. The connection wirings (1g) may transmit a start pulse (VST) of a gate-on voltage (VGL), a carry signal (CAR) of the gate-on voltage (VGL), a shift clock signal (CLK), and the like.

Figure 16:
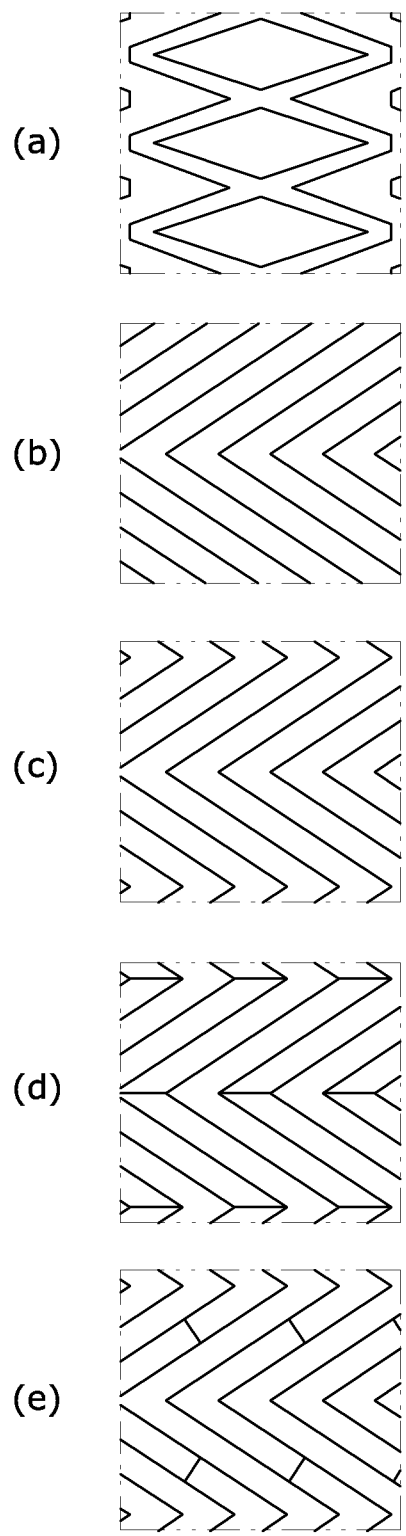
FIG. 16 is a diagram illustrating a pattern of wirings in a boundary region.

FIG. 16 is a diagram illustrating a pattern of wirings in a boundary region.

The first to fifth wirings 130-1, 130-2, 130-3, 130-4, and 130-5 disposed in the boundary region 100b are wirings disposed in a region where bending is made, that is, in the bending part 100f. Therefore, depending on the bent angle, such wirings may be designed to have a pattern for improving flexibility.

In case of wirings disposed in a region having a bending angle of about 90 degrees, for example, in case of the first wirings 130-1 disposed between the first and second displays 110a and 110b, or in case of the fourth wirings 130-4 disposed between the first and third displays 110a and 110c, the bending angle is relatively small, and thus a general linear pattern may be used. However, in order to reduce the tension applied to wirings, various patterns as shown in (a) to (e) of FIG. 16 may be provided.

In case of wirings disposed in a region having a bending angle of 90 degrees or more, for example, in case of wirings between the first to third displays 110a, 110b and 110c and the gate driver 110g, or in case of wirings between the first to third displays 110a, 110b and 110c and the gate driver 110g, the bending angle is relatively large, and thus patterns for reducing the tension applied to wirings may be provided.

Therefore, the wirings may have a pattern in which closed ring structures are connected in series as shown in (a) of FIG. 16. Alternatively, as shown in (b) and (c), the wirings may have a pattern that is bent at predetermined intervals.

Alternatively, as shown in (d) and (e), a pair of wirings constitute one wiring, and each wiring may have a pattern bent at predetermined intervals. However, these patterns are exemplary only, and the wirings may have various patterns for reducing the tension applied thereto.

Figure 17:
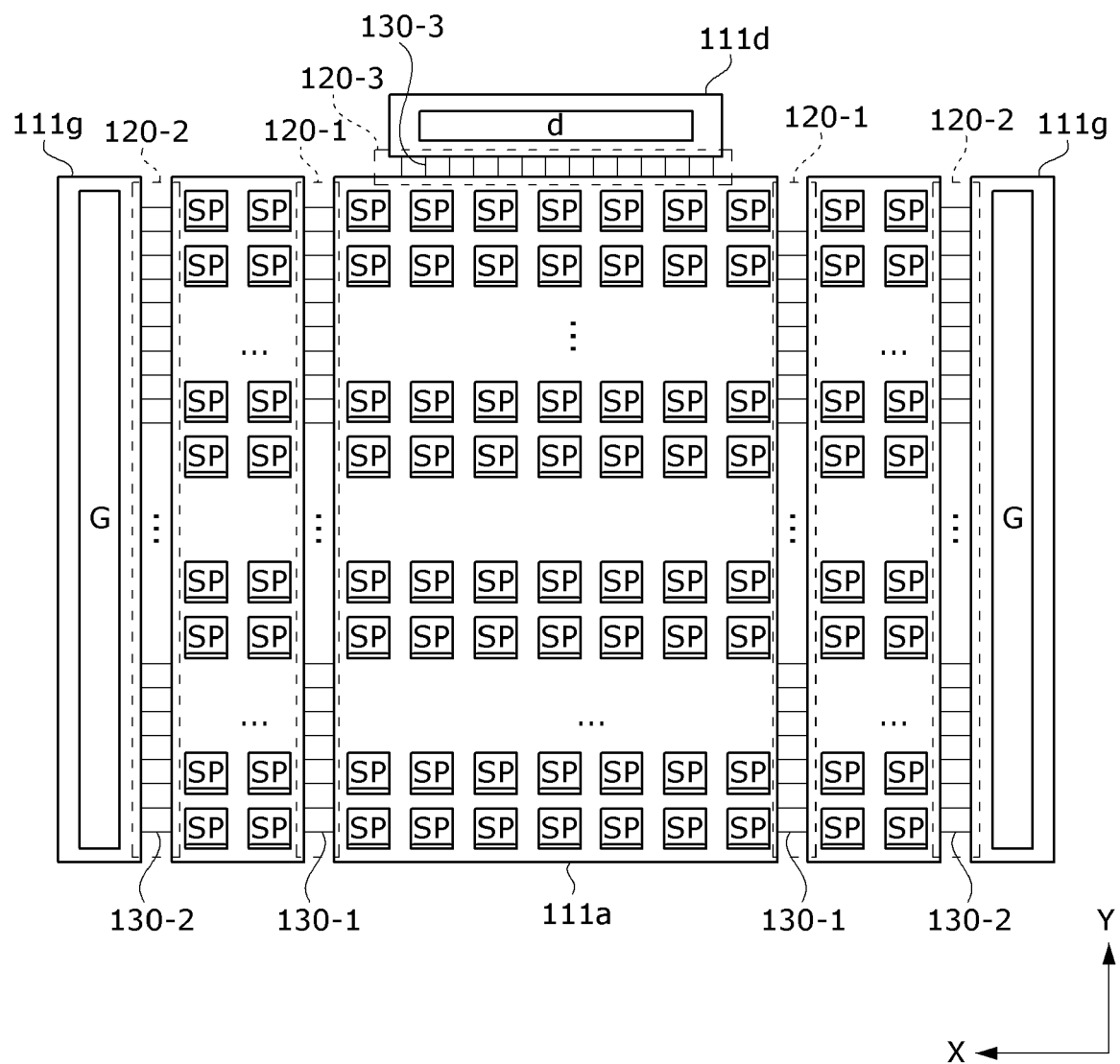
FIG. 17 is a block diagram illustrating an example of a display panel according to one aspect of the present disclosure.
Figure 18:
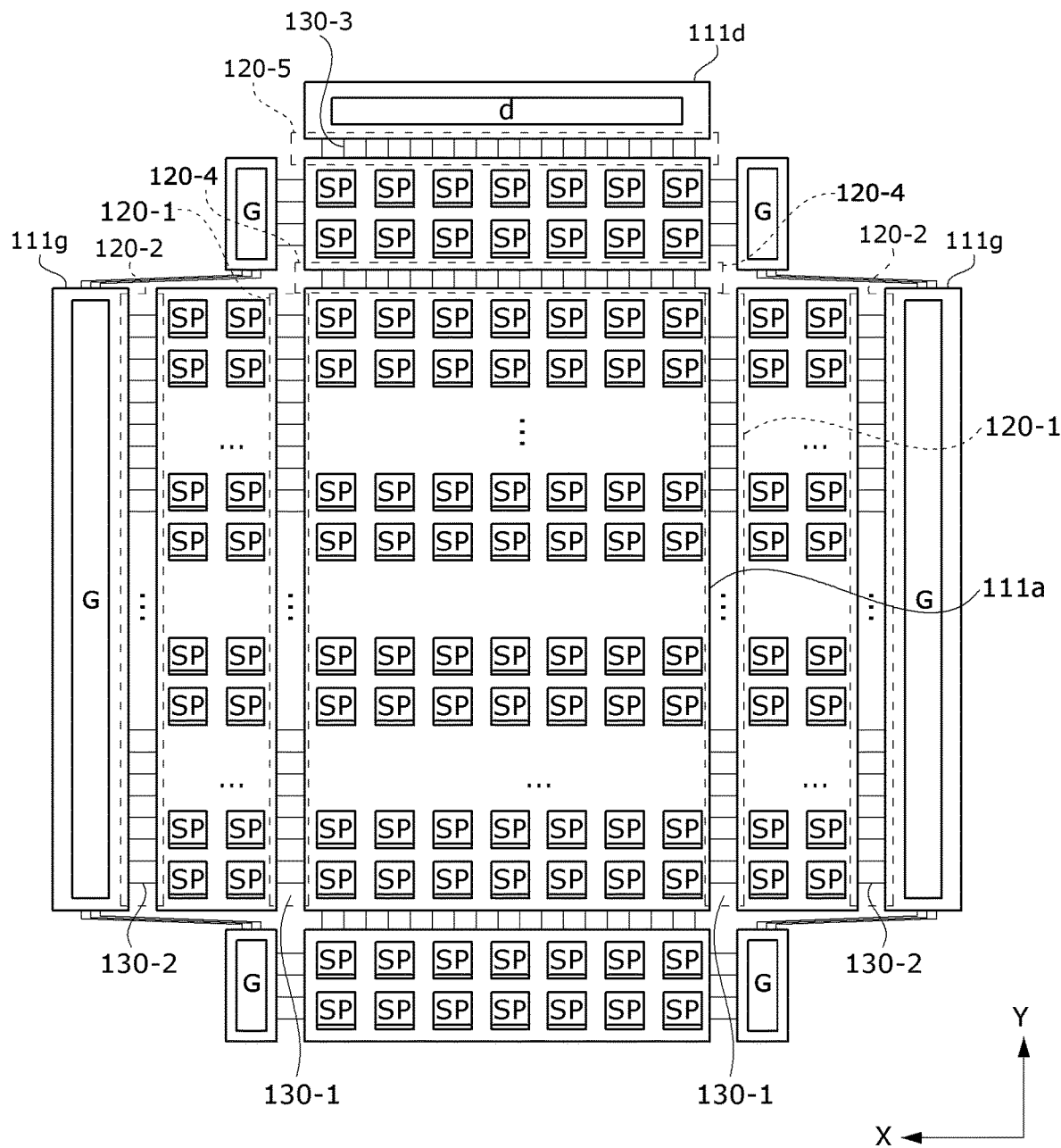
FIG. 18 is a block diagram illustrating an example of a display panel according to another aspect of the present disclosure.

FIG. 17 is a block diagram illustrating an example of a display panel according to one aspect of the present disclosure. FIG. 18 is a block diagram illustrating an example of a display panel according to another aspect of the present disclosure.

The display panel 100 illustrated in FIG. 17 may be bent around the boundary regions 100b between the first glass substrate 111a, the second glass substrate 111b, the data glass substrate 111d, and the gate glass substrate 111g. The first display 110a and the second display 110b include a pixel array of a screen on which an image is reproduced. The gate driver 110g includes the gate driving circuit G for supplying a gate pulse to the gate line. The data driver 110d includes the data driving circuit D for supplying a data pulse to the data line. The first display 110a may be a main display, and the second display 110b may be a sub display. The first display 110a may be a front display, and the second display 110b may be a side display disposed on sides of the first display 110a. Unlike FIG. 17, the second display 110b may be disposed on only one of both sides of the display device.

The display panel 100 illustrated in FIG. 18 may be bent around the boundary regions 100b between the first glass substrate 111a, the second glass substrate 111b, the third glass substrate 111c, the data glass substrate 111d, and the gate glass substrate 111g. The first display 110a, the second display 110b, and the third glass substrate 111c include a pixel array of a screen on which an image is reproduced. The gate driver 110g includes the gate driving circuit G for supplying a gate pulse to the gate line. The data driver 110d includes the data driving circuit D for supplying a data pulse to the data line. The first display 110a may be a main display, and the second and third displays 110b and 110c may be sub displays. The first display 110a may be a front display, and the second display 110b may be a side display disposed on lateral sides of the first display 110a. The third display 110c may be another side display disposed on upper and lower sides of the first display 110a. Unlike FIG. 18, the second display 110b may be disposed on only one of both lateral sides of the display device. Similarly, the third display 110c may be disposed on only one of upper and lower sides of the display device.

The pixel array of the display panel 100 includes data lines, gate lines crossing the data lines, and subpixels SP arranged in a matrix form defined by the data lines and the gate lines. The structure of the display panel 100 includes the circuit layer and the light-emitting element layer stacked on the glass substrate, as in the above-described aspects. The light-emitting element layer includes a light-emitting element of a pixel circuit.

Each of pixels includes subpixels SP having different colors for color implementation. The subpixels SP include a red subpixel (referred to as "R subpixel"), a green subpixel (referred to as "G subpixel"), and a blue subpixel (referred to as "B subpixel"). Although not shown, each of the pixels may further include a white subpixel. Hereinafter, the pixel may be interpreted as a subpixel unless otherwise defined. Each of the subpixels may include a pixel circuit.

The pixel circuit may include a light-emitting element, a driving element for supplying a current to the light-emitting element, a plurality of switch elements for programming a conduction condition of the driving element and switching a current path between the driving element and the light-emitting element, a capacitor for maintaining a gate voltage of the driving element, and the like.

A display panel driver writes pixel data of an input image to the pixels. The display panel driver includes the data driver 110*d* that supplies a data voltage of pixel data to the data lines, and the gate driver 110*g* that sequentially supplies a gate pulse to the gate lines. The data driver 110*d* may include the data driver circuit D, and the gate driver 110*g* may include the gate driver circuit G. The data driver 110*d* may be integrated in a drive IC.

The drive IC may be attached to the display panel 100. The drive IC receives pixel data of an input image and a timing signal from a host system, supplies a data voltage of the pixel data to the pixels, and synchronizes the data driver 110*d* with the gate driver 110*g*.

Figure 20:
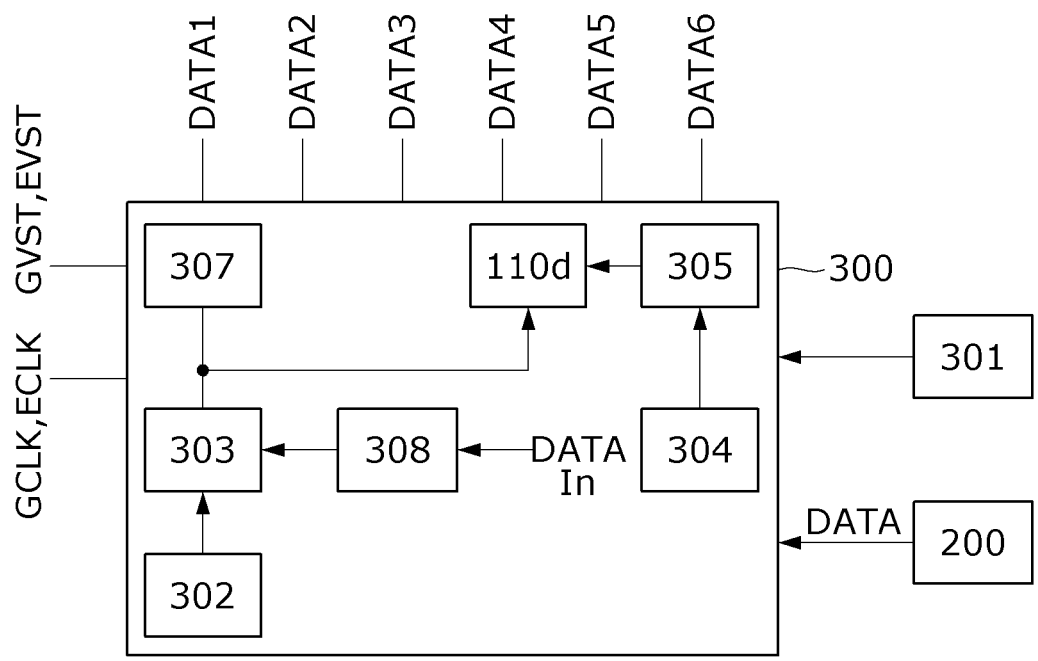
FIG. 20 is a block diagram schematically illustrating the configuration of a drive IC.

Referring to FIG. 20, the drive IC 300 is connected to data lines through data output channels and supplies a voltage of a data signal to the data lines. The drive IC may output a gate timing signal for controlling the gate driver 110*g* through gate timing signal output channels. The gate timing signal generated from a timing controller 303 may include a gate start pulse VST, a gate shift clock CLK, and the like. The start pulse VST and the shift clock CLK swing between a gate-on voltage VGL and a gate-off voltage VGH. The gate timing signals VST and CLK outputted from a level shifter 307 are applied to the gate driver 110*g* to control a shift operation of the gate driver 110*g*.

The gate driver 110*g* may include a shift register formed on the circuit layer of the display panel 100 together with a pixel array.

Figure 19:
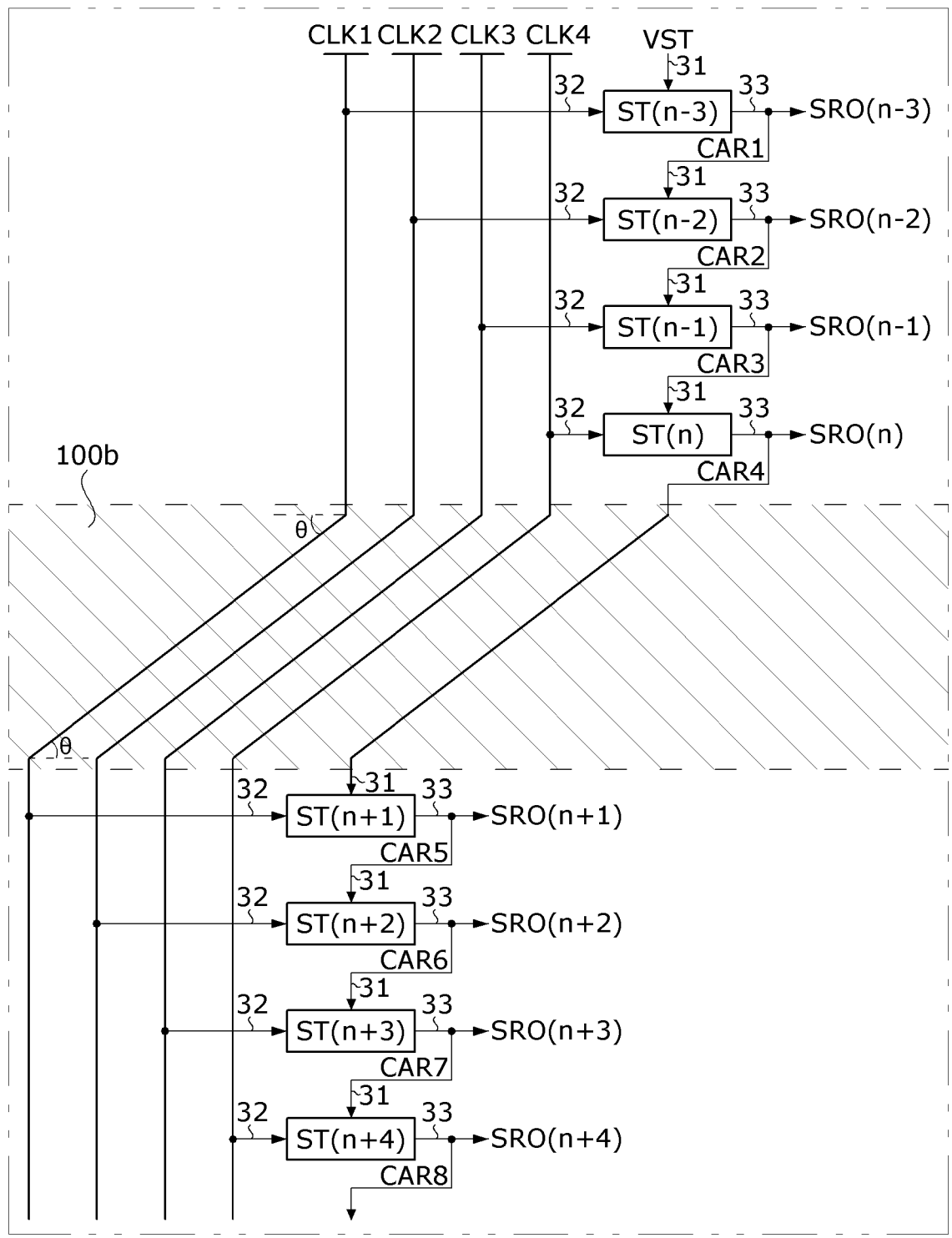
FIG. 19 is a diagram schematically illustrating a shift register of a gate driver.

FIG. 19 is a diagram schematically illustrating a shift register of a gate driver 110*g*.

Referring to FIG. 19, the gate driver 110*g* may include the shift register. The shift register includes signal transmission units ST(n−3) to ST(n+4) that are dependently connected. Each of the signal transmission units ST(n−3) to ST(n+4) includes a start signal input node 31, a clock input node 32, and an output node 33.

In the present disclosure, a voltage applied to the start signal input node 31 of each of the signal transmission units ST(n−3) to ST(n+4) is selected to control an active area, an inactive area, a high-speed driving area, and a low-speed driving area. A start pulse VST, carry signal CAR, or gate high voltage VGH of a gate-on voltage VGL may be applied to the start signal input node 31.

When the start pulse VST of the gate-on voltage VGL is inputted to the start signal input node 31, each of the signal transmission units ST(n−3) to ST(n+4) may output a gate pulse in the active area. When the gate-on voltage VGL or the shift clock of the gate-on voltage VGL is inputted in a state where the first control node Q is pre-charged by the gate-on voltage VGL of the start pulse VST, a pull-up transistor is turned on, and the gate-on voltage VGL is outputted through the output node. Therefore, the signal transmission unit to which the start pulse VST is inputted may be a first signal transmission unit that outputs a first gate pulse on the entire screen, or a first signal transmission unit that outputs a first gate pulse for each divided regions when the screen is dividedly driven.

The gate pulse may be a scan pulse and/or an EM pulse. The gate pulse is generated by the gate-on voltage VGL to turn on the switch element of the pixel circuit. The high-speed driving area is driven with a high frame frequency when a high-frequency start pulse (VST) is inputted. The low-speed driving area is driven with a low frame frequency when a low-frequency start pulse (VST) is inputted.

When the carry signal CAR of the gate-on voltage VGL is inputted to the start signal input node 31, each of the signal transmission units ST(n−3) to ST(n+4) may output a next pulse after the preceding signal transmitting unit outputs a gate pulse. When the gate-on voltage VGL or the shift clock of the gate-on voltage VGL is inputted to the pull-up transistor in a state where the first control node is pre-charged by the carry signal CAR of the gate-on voltage VGL, the pull-up transistor is turned on and the gate-on voltage VGL is outputted through the output node. Therefore, the signal transmission unit to which the carry signal CAR is inputted may be a signal transmission unit that sequentially outputs gate pulses after the first gate pulse on the entire screen, or a signal transmission unit that sequentially outputs gate pulses after the first gate pulse for each divided regions when the screen is dividedly driven.

Each of the signal transmission units ST(n−3) to ST(n+4) cannot output the gate-on voltage when the gate-off voltage VGH is inputted to the input node 31 without the start pulse VST and the carry signal CAR. This is because the first control node cannot be pre-charged and the pull-up transistor cannot be turned on. Therefore, a pixel connected to the signal transmission unit to which the gate-off voltage VGH is inputted without the start pulse VST and the carry signal CAR during one frame period is not updated with new pixel data, so that it is a pixel in the low-speed driving area that maintains the data voltage of the pixel data charged in the previous frame period, or a pixel in the inactive area that displays black gradation.

The shift clocks CLK1 to CLK4 are inputted to the signal transmission units ST(n−3) to ST(n+4) through the clock input node 32. The first shift clock CLK1 may be inputted to the n−3th signal transmission unit ST(n−3), and the second shift clock CLK2 may be inputted to the n−2th signal transmission unit ST(n−2). The third shift clock CLK3 may be inputted to the n−1th signal transmission unit ST(n−1), and the fourth shift clock CLK4 may be inputted to the nth signal transmission unit ST(n). The first shift clock CLK1 may be inputted to the n+1th signal transmission unit ST(n+1), and the second shift clock CLK2 may be inputted to the n+2th signal transmission unit ST(n+2). The third shift clock CLK3 may be inputted to the n+3th signal transmission unit ST(n+3), and the fourth shift clock CLK4 may be inputted to the n+4th signal transmission unit ST(n+4).

Referring to FIG. 19, the connection wires 1*g* disposed in the boundary region 100*b* may be bent at a predetermined angle θ as described above. In addition, as shown in FIG. 19, a distance between the nth signal transmitting unit ST(n) and the n+1th signal transmitting unit ST(n+1) may be greater than a distance between the n−1th signal transmitting unit ST(n−1) and the nth signal transmission unit ST(n). This is because the boundary region 100*b* may be positioned between the nth signal transmission unit ST(n) and the n+1th signal transmission unit ST(n+1).

The signal transmission units ST(n−3) to ST(n+4) output the gate pulses SRO(n−3) to SRO(n+4), respectively, through the output node 33. Only when the voltage of the first control node Q is pre-charged to each of the signal transmission units ST(n−3) to ST(n+4), the gate-on voltage VGL can be outputted through the output node 33.

During the driving frame period in which the gate pulses are sequentially outputted from the gate driver, the shift register receives the start pulse (VST) or the carry signals CAR1 to CAR8 received from the previous signal transmission unit, outputs the gate pulses SRO(n−3) to SRO(n+4) in synchronization with rising edges of the shift clocks CLK1 to CLK4, and shifts the gate pulses SRO(n−3) to SRO(n+4) in synchronization with the rising edges of the shift clocks.

FIG. 20 is a block diagram schematically illustrating the configuration of a drive IC.

Referring to FIG. 20, the drive IC 300 may be connected to a host system 200, a first memory 301, and the display panel 100. The drive IC 300 may include a data receiver and operator 308, a timing controller 303, a data driver 110d, a gamma compensation voltage generator 305, a power supplier 304, a second memory 302, and the like.

The data receiver and operator 308 includes a receiver that receives pixel data inputted as a digital signal from the host system 200, and a data operator that processes the pixel data inputted through the receiver to improve image quality. The data operator may include a data restorer that decodes and restores compressed pixel data, and an optical compensator that adds a preset optical compensation value to the pixel data. The optical compensation value may be set as a value for correcting the luminance of each pixel data, based on the luminance of a screen measured based on a camera image captured in a manufacturing process.

The timing controller 303 provides pixel data of an input image received from the host system 200 to the data driver 110d. The timing controller 303 generates a gate timing signal for controlling the gate driver 110g and a source timing signal for controlling the data driver 110d, thereby controlling the operation timing of the gate driver 110g and the data driver 110d.

The data driver 110d converts the pixel data (digital signal) received from the timing controller 303 with a gamma compensation voltage through a digital to analog converter (DAC) to output the voltage (data voltage) of data signals DATA1 to DATA6. The data voltage outputted from the data driver 110d is supplied to the data lines of the pixel array through an output buffer (source AMP) connected to the data channel of the drive IC 300.

The gamma compensation voltage generator 305 generates a gamma compensation voltage for each gradation by dividing a gamma reference voltage from the power supplier 304 through a voltage dividing circuit. The gamma compensation voltage is an analog voltage that is set for each gradation of pixel data. The gamma compensation voltage outputted from the gamma compensation voltage generator 305 is provided to the data driver 110d.

The power supplier 304 generates power required for driving the pixel array of the display panel 100, the gate driver 110g, and the drive IC 300 by using a DC-DC converter. The DC-DC converter may include a charge pump, a regulator, a buck converter, a boost converter, and the like. The power supplier 304 may generate DC power such as a gamma reference voltage, a gate-on voltage VGL, a gate-off voltage VGH, a pixel driving voltage ELVDD, a low-potential power voltage ELVSS, and an initialization voltage Vini by adjusting a DC input voltage from the host system 200. The gamma reference voltage is supplied to the gamma compensation voltage generator 305. The gate-on voltage VGL and the gate-off voltage VGH are supplied to the level shifter 307 and the gate driver 110g. Pixel power such as the pixel driving voltage ELVDD, the low-potential power voltage ELVSS, and the initialization voltage Vini are commonly supplied to the pixels. The initialization voltage Vini is set to a DC voltage lower than the pixel driving voltage ELVDD and lower than the threshold voltage of the light emitting element (OLED), thereby suppressing the light emission of the light emitting element OLED.

The second memory 302 stores a compensation value, register setting data, and the like received from the first memory 301 when power is supplied to the drive IC 300. The compensation value may be applied to various algorithms for improving image quality. The compensation value may include an optical compensation value. The register setting data defines the operation of the data driver 110d, the timing controller 303, the gamma compensation voltage generator 305, and the like. The first memory 301 may include a flash memory. The second memory 302 may include static RAM (SRAM).

The host system 200 may be implemented with an application processor (AP). The host system 200 may transmit pixel data of an input image to the drive IC 300 through a mobile industry processor interface (MIPI). The host system 200 may be connected to the drive IC 300 through a flexible printed circuit (FPC), for example.

In the display device of an aspect, the pixel circuit and the gate driver 110g may include a plurality of transistors. Such transistors may be implemented with an oxide thin film transistor (oxide TFT) including an oxide semiconductor, a low temperature polysilicon (LTPS) TFT including LTPS, or the like. Each of the transistors may be implemented with a p-channel TFT or an n-channel TFT. In an aspect, the transistors of the pixel circuit are described as being implemented with the p-channel TFT, but the present disclosure is not limited thereto.

The transistor is a three-electrode device including a gate, a source, and a drain. The source is an electrode that supplies a carrier to the transistor. In the transistor, carriers start flowing from the source. The drain is an electrode through which carriers exit from the transistor. In the transistor, carriers flow from the source to the drain. In case of an n-channel transistor, carriers are electrons, and a source voltage is lower than a drain voltage so that electrons flow from the source to the drain. In the n-channel transistor, the direction of a current is from the drain to the source. In a case of a p-channel transistor (PMOS), carriers are holes, and the source voltage is higher than the drain voltage so that holes flow from the source to the drain. In the p-channel transistor, since holes flow from the source to the drain, a current flows from the source to the drain. The source and drain of the transistor are not fixed. For example, the source and drain may be changed depending on the applied voltage. Therefore, the disclosure is not limited due to the source and drain of the transistor. In the following description, the source and drain of the transistor will be referred to as first and second electrodes.

A gate pulse swings between the gate-on voltage and the gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, and turned off in response to the gate-off voltage. In case of the n-channel transistor, the gate-on voltage may be a gate high voltage VGH, and the gate-off voltage may be a gate low voltage VGL. In case of the p-channel transistor, the gate-on voltage may be the gate low voltage VGL, and the gate-off voltage may be the gate high voltage VGH.

In each of the pixels, a driving element may be implemented with the transistor. The driving element should have uniform electrical characteristics among all pixels, but the electrical characteristics may differ between pixels due to process variations and element characteristics variations and may change over the lapse of display driving time. In order to compensate for such differences in electrical characteristics of the driving element, the display device may include an internal compensation circuit and an external compensation circuit. The internal compensation circuit is added to the pixel circuit in each subpixel, samples the threshold voltage (Vth) and/or the mobility (μ) of the driving element, changing depending on the electrical characteristics of the driving element, and compensates for such changes in real time. The external compensation circuit transmits the threshold voltage and/or the mobility of the driving element sensed through a sensing line connected to each subpixel to an external compensator. The compensator of the external compensation circuit compensates for changes in electrical characteristics of the driving element by modulating the pixel data of the input image based on the sensing result. That is, by sensing a voltage of a pixel that changes according to the electrical characteristics of the driving element, and by modulating the data of the input image in the external circuit based on the sensed voltage, the electrical characteristic deviation of the driving element between pixels is compensated.

Figure 21:
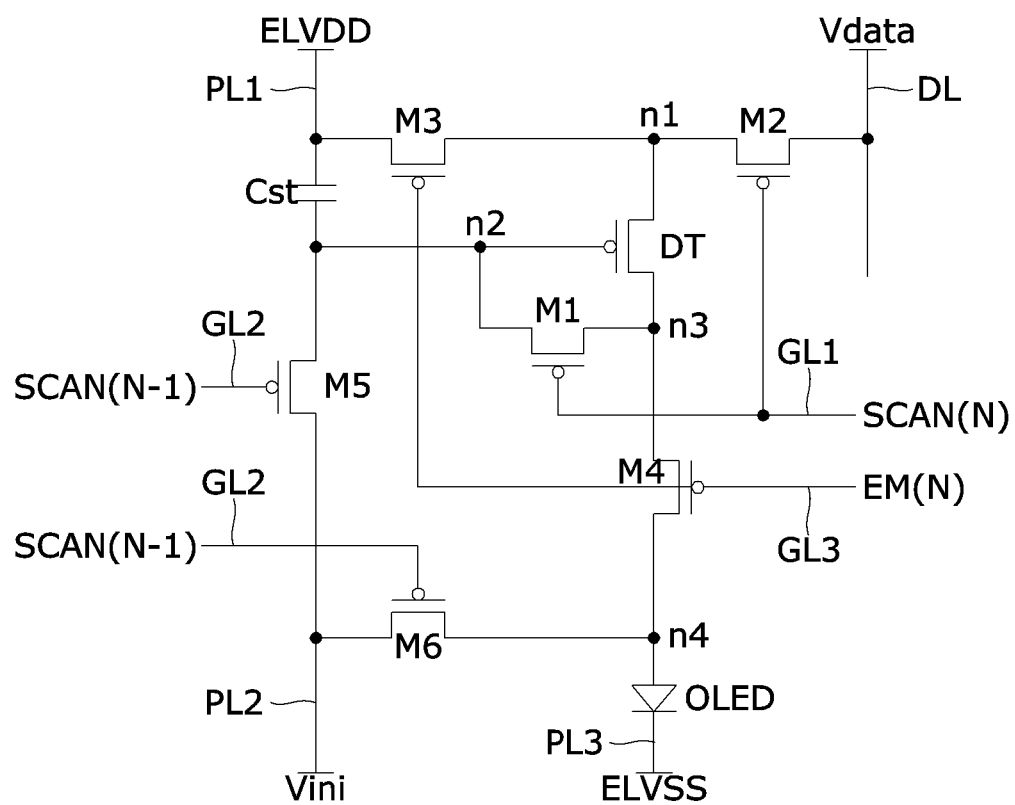
FIG. 21 is a circuit diagram illustrating an example of a pixel circuit.
Figure 22:
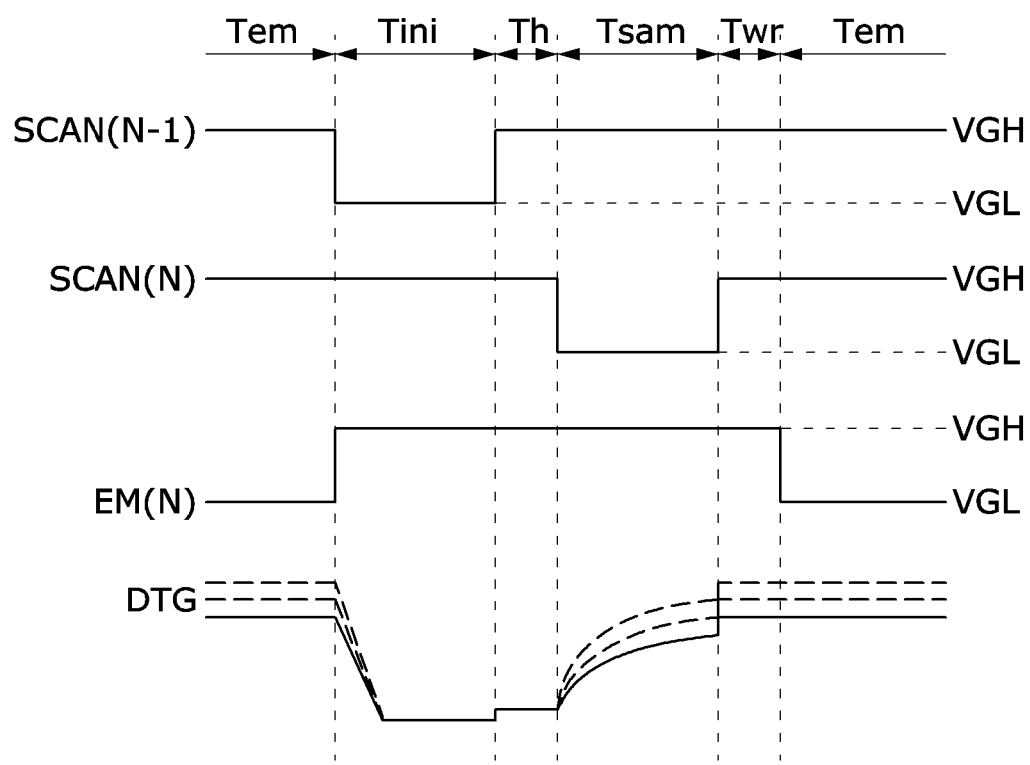
FIG. 22 is a diagram illustrating a method of driving the pixel circuit shown in FIG. 21.

FIG. 21 is a circuit diagram illustrating an example of a pixel circuit. FIG. 22 is a diagram illustrating a method of driving the pixel circuit shown in FIG. 21. The pixel circuit applicable to the present disclosure is not limited to FIGS. 21 and 22.

Referring to FIGS. 21 and 22, the pixel circuit includes a light emitting element OLED, a driving element DT that supplies a current to the OLED, and an internal compensation circuit that samples a threshold voltage Vth of the driving element DT by using a plurality of switch elements M1 to M6 and compensates for a gate voltage of the driving element DT by the threshold voltage Vth of the driving element DT. Each of the driving element DT and the switch elements M1 to M6 may be implemented with a p-channel TFT.

A driving time of the pixel circuit using the internal compensation circuit may be divided into an initialization time (Tini), a sampling time (Tsam), a data writing time (Twr), and a light emission time (Tem).

During the initialization time Tini, the N−1th scan signal SCAN(N−1) is generated as a pulse of the gate-on voltage VGL, and a voltage of each of the Nth scan signal SCAN(N) and the light emission signal EM(N) is the gate-off voltage VGH. During the sampling time Tsam, the Nth scan signal SCAN(N) is generated as a pulse of the gate-on voltage VGL, and each voltage of the N−1th scan signal SCAN(N−1) and the light emission signal EM(N) is the gate-off voltage VGH. During the data writing time Twr, each voltage of the N−1th scan signal SCAN(N−1), the Nth scan signal SCAN(N), and the light emission signal EM(N) is the gate-off voltage VGH. During at least a part of the light emission time Tem, the light emission signal EM(N) is generated with the gate-on voltage VGL, and each of the N−1th scan signal SCAN(N−1) and the Nth scan signal SCAN (N) is generated with the gate-off voltage VGH.

During the initialization time Tin, the fifth and sixth switch elements M5 and M6 are turned on according to the gate-on voltage VGL of the N−1th scan signal SCAN(N−1), and the pixel circuit is initialized. During the sampling time Tsam, the first and second switch elements M1 and M2 are turned on according to the gate-on voltage VGL of the N-th scan signal SCAN(N), and the threshold voltage of the driving element DT is sampled and stored in the capacitor Cst. During the data writing time Twr, the first to sixth switch elements M1 to M6 are maintained in an off state. During the light emission time Temp, the third and fourth switch elements M3 and M4 are turned on, and the OLED emits light. In the light emission time Tem, in order to accurately express the luminance of the low gradation with the duty ratio of the light emission signal EM(N), the light emission signal EM(N) may swing at a predetermined duty ratio between the gate-on voltage VGL and the gate-off voltage VGH, and the third and fourth switch elements M3 and M4 may be repeatedly turned on/off.

The OLED may be implemented with an organic light emitting diode or an inorganic light emitting diode. Hereinafter, an example in which the OLED is implemented with the organic light emitting diode will be described.

The OLED may include an organic compound layer formed between the anode and the cathode. The organic compound layer may include a hole injection layer (HIL), a hole transport layer (HTL), an emission layer (EML), an electron transport layer (ETL), and an electron injection layer (EIL), but this is not a limitation. When a voltage is applied to the anode and cathode of the OLED, holes passing through the hole transport layer (HTL) and electrons passing through the electron transport layer (ETL) move to the emission layer (EML) and form excitons, so that visible light is emitted from the emission layer (EML).

The anode of the OLED is connected to the fourth node n4 between the fourth and sixth switch elements M4 and M6. The fourth node n4 is connected to the anode of the OLED, the second electrode of the fourth switch element M4, and the second electrode of the sixth switch element M6. The cathode of the OLED is connected to the VSS electrode PL3 to which the low-potential power voltage VSS is applied. The OLED emits light with a current Ids flowing according to the gate-source voltage Vgs of the driving element DT. A current path of the OLED is switched by the third and fourth switch elements M3 and M4.

The storage capacitor Cst is connected between the VDD line PL1 and the first node n1. The data voltage Vdata compensated by the threshold voltage Vth of the driving element DT is charged in the storage capacitor Cst. Since the data voltage Vdata is compensated by the threshold voltage Vth of the driving element DT in each subpixel, a characteristic variation of the driving element DT is compensated for in the subpixels.

The first switch element M1 is turned on in response to the gate-on voltage VGL of the Nth scan pulse SCAN(N) and connects the second node n2 and the third node n3. The second node n2 is connected to the gate of the driving element DT, the first electrode of the storage capacitor Cst, and the first electrode of the first switch element M1. The third node n3 is connected to the second electrode of the driving element DT, the second electrode of the first switch element M1, and the first electrode of the fourth switch element M4. The gate of the first switch element M1 is connected to the first gate line GL1 and receives the Nth scan pulse SCAN(N). The first electrode of the first switch element M1 is connected to the second node n2, and the second electrode of the first switch element M1 is connected to the third node n3.

The second switch element M2 is turned on in response to the gate-on voltage VGL of the Nth scan pulse SCAN(N) and supplies the data voltage Vdata to the first node n1. The gate of the second switch element M2 is connected to the first gate line GL1 and receives the Nth scan pulse SCAN (N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M2, and the first electrode of the driving element DT.

The third switch element M3 is turned on in response to the gate-on voltage VGL of the emission signal EM(N) and connects the VDD line PL1 to the first node n1. The gate of the third switch element M3 is connected to the third gate line GL3 and receives the light emission signal EM(N). The first electrode of the third switch element M3 is connected to the VDD line PL1. The second electrode of the third switch element M3 is connected to the first node n1.

The fourth switch element M4 is turned on in response to the gate-on voltage VGL of the light emission signal EM(N) and connects the third node n3 to the anode of the OLED. The gate of the fourth switch element M4 is connected to the third gate line GL3 and receives the emission signal EM(N). The first electrode of the fourth switch element M4 is connected to the third node n3, and the second electrode is connected to the fourth node n4.

The fifth switch element M5 is turned on in response to the gate-on voltage VGL of the N−1th scan pulse SCAN(N−1) and connects the second node n2 to the Vini line PL2. The gate of the fifth switch element M5 is connected to the second gate line GL2 and receives the N−1th scan pulse SCAN(N−1). The first electrode of the fifth switch element M5 is connected to the second node n2, and the second electrode is connected to the Vini line PL2.

The sixth switch element M6 is turned on in response to the gate-on voltage VGL of the N−1th scan pulse SCAN(N−1) and connects the Vini line PL2 to the fourth node n4. The gate of the sixth switch element M6 is connected to the second gate line GL2 and receives the N−1th scan pulse SCAN(N−1). The first electrode of the sixth switch element M6 is connected to the Vini line PL2, and the second electrode is connected to the fourth node n4.

The driving element DT drives the OLED by adjusting the current Ids flowing through the OLED according to the gate-source voltage Vgs. The driving element DT includes the gate connected to the second node n2, the first electrode connected to the first node n1, and the second electrode connected to the third node n3.

During the initialization time Tini, the N−1th scan pulse SCAN(N−1) is generated with the gate-on voltage VGL. The Nth scan pulse SCAN(N) and the light emission signal EM(N) maintain the gate-off voltage VGH during the initialization time Tini. Therefore, the fifth and sixth switch elements M5 and M6 are turned on during the initialization time Tini, so that the second and fourth nodes n2 and n4 are initialized to Vini. A hold time Th may be set between the initialization time Tini and the sampling time Tsam. In the hold time Th, the gate pulses SCAN(N−1), SCAN(N), and EM(N) maintain their previous state.

During the sampling time Tsam, the Nth scan pulse SCAN(N) is generated with the gate-on voltage VGL. The Nth scan pulse SCAN(N) is synchronized with the data voltage Vdata of the Nth pixel line. The N−1th scan pulse SCAN(N−1) and the emission signal EM(N) maintain the gate-off voltage VGH during the sampling time Tsam. Therefore, the first and second switch elements M1 and M2 are turned on during the sampling time Tsam.

During the sampling time Tsam, the gate voltage DTG of the driving element DT is increased by the current flowing through the first and second switch elements M1 and M2. When the driving element DT is turned off, the gate node voltage DTG is Vdata−|Vth| because the driving element DT is turned off. At this time, the voltage of the first node n is also Vdata−|Vth|. During the sampling time Tsam, the gate-source voltage Vgs of the driving element DT is |Vgs|=Vdata−(Vdata−|Vth|)=|Vth|.

During the data writing time Twr, the Nth scan pulse SCAN(N) is inverted to the gate-off voltage VGH. The N−1th scan pulse SCAN(N−1) and the light emission signal EM(N) maintain the gate-off voltage VGH during the data writing time Twr. Therefore, all of the switch elements M1 to M6 are maintained in the off state during the data writing time Twr.

During the light emission time Temp, the light emission signal EM(N) may be generated with the gate-off voltage VGH. During the light emission time Tem, the light emission signal EM(N) swings between the gate-on voltage VGL and the gate-off voltage VGH while being turned on/off at a predetermined duty ratio in order to improve the low gradation expression. Therefore, the light emission signal EM(N) may be generated with the gate-on voltage VGL during at least a part of the light emission time Temp.

When the light emission signal EM(N) is the gate-on voltage VGL, a current flows between the ELVDD and the OLED, and thus the OLED may emit light. During the light emission time Tem, the N−1th and Nth scan pulses SCAN(N−1) and SCAN(N) maintain the gate-off voltage VGH. During the light emission time Temp, the third and fourth switch elements M3 and M4 repeat on/off depending on the voltage of the light emission signal EM. When the light emission signal EM(N) is the gate-on voltage VGL, the third and fourth switch elements M3 and M4 are turned on, and thus a current flows through the OLED. At this time, Vgs of the driving element DT is |Vgs|=ELVDD−(Vdata−|Vth|), and the current flowing through the OLED is K(ELVDD−Vdata)2. Here, K is a constant value determined by charge mobility, parasitic capacitance, channel capacity, and the like of the driving element DT.

Figure 23:
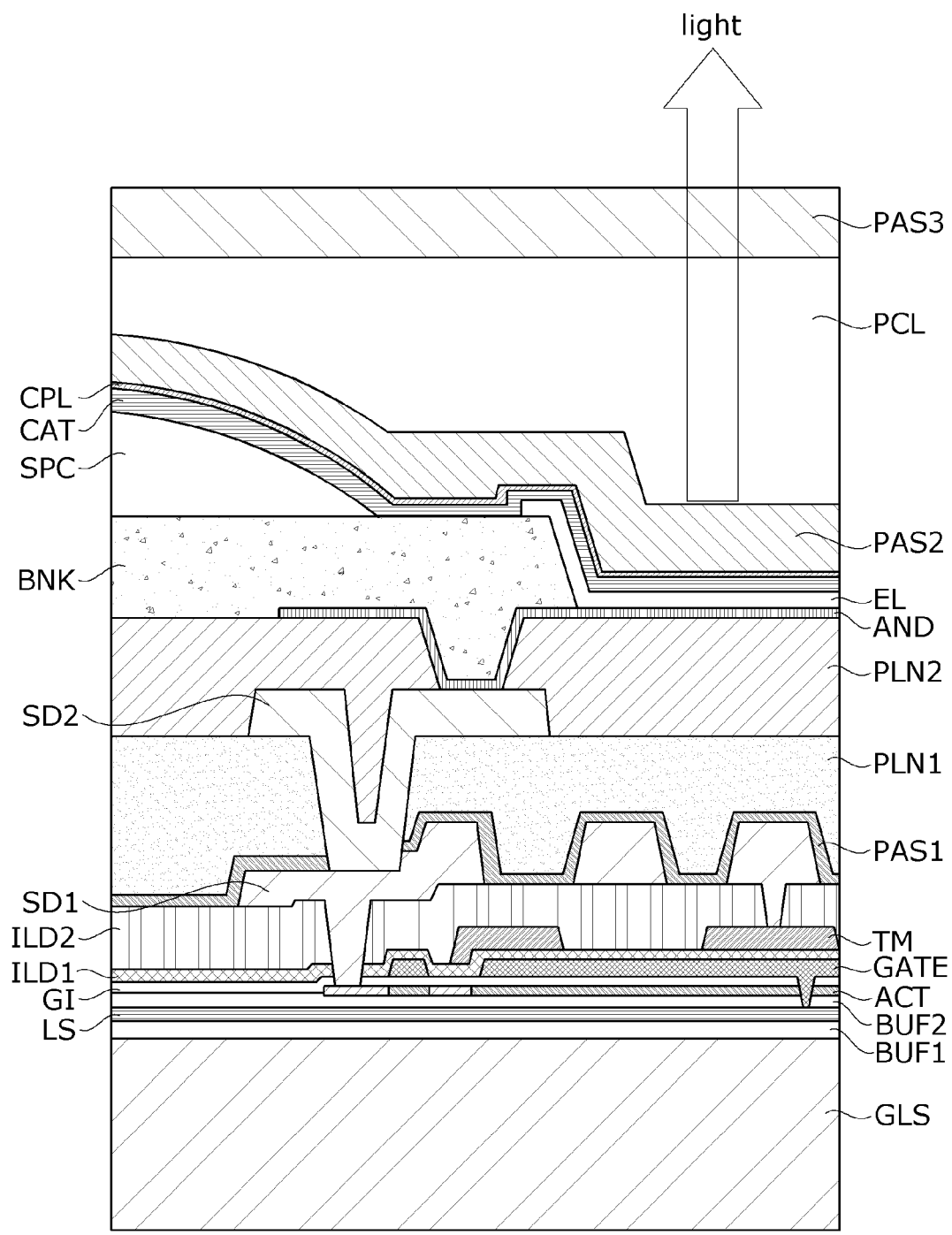
FIG. 23 is a cross-sectional diagram illustrating a cross-section of a display panel according to one aspect of the present disclosure.

FIG. 23 is a cross-sectional diagram illustrating a cross-section of a display panel 100 according to one aspect of the present disclosure. A cross-sectional structure of the display panel 100 illustrated in FIG. 23 is only an example, and the present disclosure is not limited thereto.

Referring to FIG. 23, the circuit layer, the light-emitting element layer, the encapsulation layer, and the like may be stacked on the glass substrate GLS as described above.

A first buffer layer BUF1 may be formed on the glass substrate GLS. A first metal layer LS may be formed on the first buffer layer BUF1, and a second buffer layer BUF2 may be formed on the first metal layer LS. Each of the first and second buffer layers BUF1 and BUF2 may be formed of an inorganic insulating material and may be composed of one or more insulating layers. The first metal layer LS may include a metal pattern disposed under the TFT to block light irradiated to the semiconductor channel layer of the TFT.

An active layer ACT may be formed on the second buffer layer BUF2. The active layer ACT includes a semiconductor pattern of each TFT of the pixel circuit and of each TFT of the gate driver. When the TFT is implemented with an oxide TFT, the semiconductor pattern may include indium gallium zinc oxide (IGZO).

A gate insulating layer GI may be formed on the active layer ACT. The gate insulating layer GI is an insulating layer formed of an inorganic insulating material. A second metal layer GATE may be formed on the gate insulating layer GI. The second metal layer GATE may include a gate electrode of the TFT and a gate line connected to the gate electrode.

A first interlayer dielectric layer ILD1 may cover the second metal layer GATE. A third metal layer TM may be formed on the first interlayer dielectric layer ILD2, and a second interlayer dielectric layer ILD2 may cover the third metal layer TM. A capacitor Cst of the pixel circuit may be formed in a portion where the second metal layer GATE, the first interlayer dielectric layer ILD1, and the third metal layer TM overlap. The first and second interlayer dielectric layers ILD1 and ILD2 may include an inorganic insulating material.

A fourth metal layer SD1 may be formed on the second interlayer dielectric layer ILD2, and a first inorganic passivation layer PAS1 and a first planarization layer PLN1 may be stacked thereon. A fifth metal layer SD2 may be formed on the first planarization layer PLN1. A second planarization layer PLN2 may be stacked on the first planarization PLN1 to cover the fifth metal layer SD2. The fifth metal layer SD2 may be connected to the fourth metal layer SD1 through a contact hole penetrating the first planarization layer PLN1 and the first inorganic passivation layer PAS1. The first and second planarization layers PLN1 and PLN2 are made of an organic insulating material that flattens the surface.

The fourth metal layer SD1 may include first and second electrodes of the TFT connected to the semiconductor pattern of the TFT through a contact hole penetrating the second interlayer dielectric layer ILD2. A data line DL and power lines PL1 and PL2 may be implemented by patterning the fourth metal layer SD1 or the fifth metal layer SD2.

An anode electrode AND of the OLED may be formed on the second planarization layer PLN2. The anode electrode AND may be connected to an electrode of the TFT used as a switch element or a driving element through a contact hole penetrating the second planarization layer PLN2. The anode electrode AND may be made of a transparent or translucent electrode material.

A pixel defining layer BNK may cover the anode electrode AND of the OLED. The pixel defining layer BNK is formed as a pattern that defines an emission area (or an opening area) through which light passes from each pixel to the outside. A spacer SPC may be formed on the pixel defining layer BNK. The pixel defining layer BNK and the spacer SPC may be integrated with the same organic insulating material. The spacer SPC secures a gap between a fine metal mask (FMM) and the anode electrode AND so that the FMM does not contact the anode electrode AND in a deposition process of an organic compound EL.

The organic compound EL is formed in the emission area of each pixel defined by the pixel defining layer BNK. A cathode electrode CAT of the OLED is formed on the entire surface of the display panel 100 to cover the pixel defining layer BNK, the spacer SPC, and the organic compound EL. The cathode electrode CAT may be connected to a VSS electrode PL3 formed by any one of underlying metal layers. A capping layer CPL may cover the cathode electrode CAT. The capping layer CPL is formed of an inorganic insulating material and protects the cathode electrode CAT by blocking the penetration of air and out-gassing of an organic insulating material applied on the capping layer CPL. A second inorganic passivation layer PAS2 may cover the capping layer CPL, and a planarization layer PCL may be formed on the second inorganic passivation layer PAS2. The planarization layer PCL may include an organic insulating material. A third inorganic passivation layer PAS3 may be formed on the planarization layer PCL.

The above-described aspects of the present disclosure may be applied alone or in combination.

The above description of various aspects does not specify essential features of claims, the scope of claims is not limited to matters described in the present disclosure.

While aspects of the present disclosure have been described in detail above with reference to the accompanying drawings, the present disclosure is not necessarily limited to these aspects, and various changes and modifications may be made without departing from the subject matter of the present disclosure. Accordingly, the aspects disclosed herein are to be considered descriptive and not restrictive of the subject matter of the present disclosure, and the scope of the subject matter of the present disclosure is not limited by these aspects. Therefore, the above-described aspects should be understood to be exemplary and not limiting in any aspect. The scope of the present disclosure should be construed by the appended claims, and all subject matters within the scopes of their equivalents should be construed as being included in the scope of the present disclosure.

What is claimed is:

1. A display panel comprising:
   a first display disposed on a first glass substrate;
   a second display disposed on a second glass substrate adjacent to the first glass substrate; and
   a first organic layer connecting the first glass substrate and the second glass substrate,
   wherein each of the first display and the second display includes a plurality of first gate lines disposed in a first direction, a plurality of first data lines disposed in a second direction crossing the first direction, and first subpixels defined by the plurality of first gate lines and the plurality of first data lines which cross each other,
   wherein first wirings electrically connecting the first subpixels of the first display and the first subpixels of the second display are disposed on the first organic layer,
   wherein each of the first wirings includes a first main wiring and a first auxiliary wiring connected in parallel to the first main wiring, and
   wherein the first main wiring and the first auxiliary wiring overlap with each other.

2. The display panel of claim 1, further comprising:
   a gate glass substrate adjacent to the second glass substrate and on which a gate driver supplying gate pulses to the plurality of first gate lines of the first and second displays is disposed;
   a second organic layer connecting the second glass substrate and the gate glass substrate;
   a data glass substrate adjacent to the first glass substrate and on which a data driver supplying data voltages to the plurality of first data lines of the first and second displays is disposed; and
   a third organic layer connecting the first glass substrate and the data glass substrate.

3. The display panel of claim 2, further comprising:
   second wirings disposed on the second organic layer and electrically connecting the gate driver and the second display; and
   third wirings disposed on the third organic layer and electrically connecting the data driver and the first display.

4. The display panel of claim 3, wherein each of the first to third wirings includes a plurality of ring structures connected in series.

5. The display panel of claim 3, wherein each of the first to third wirings includes a pattern bent at predetermined intervals.

6. The display panel of claim 3, wherein the first wirings and the second wirings are extended from the first gate lines of the first and second displays, and
   wherein the third wirings are extended from the first data lines of the first and second displays.

7. The display panel of claim 3, wherein each of the first display and the second display includes:
   a circuit layer disposed on the first and second glass substrates;

a light-emitting element layer disposed on the circuit layer;

an encapsulation layer covering the circuit layer and the light-emitting element layer;

a polarizing plate disposed on the encapsulation layer; and a cover glass disposed on the polarizing plate, wherein the first glass substrate and the second glass substrate form a predetermined angle around the first organic layer, wherein the first glass substrate and the data glass substrate form a predetermined angle around the third organic layer, and wherein the second glass substrate and the gate glass substrate form a predetermined angle around the second organic layer.

8. The display panel of claim 7, wherein the first glass substrate and the second glass substrate form an angle ranging from 0 to 90 degrees, wherein the first glass substrate and the data glass substrate form an angle ranging from 90 to 180 degrees, and wherein the second glass substrate and the gate glass substrate form an angle ranging from 90 to 180 degrees.

9. The display panel of claim 1, further comprising:

an insulating layer disposed on the first organic layer and covering the first main wiring, wherein the first auxiliary wiring is disposed on the insulating layer, and is connected in parallel to the first main wiring through contact hole formed in the insulating layer.

10. The display panel of claim 9, wherein each of the first subpixels includes a first electrode, an organic compound layer disposed on the first electrode, and a second electrode disposed on the organic compound layer, and wherein the first auxiliary wiring includes a same material as the first electrode.

11. The display panel of claim 1, further comprising:

a third display disposed on a third glass substrate adjacent to the first glass substrate in the second direction; and a fourth organic layer connecting the first glass substrate and the third glass substrate, wherein the third display includes a plurality of second gate lines disposed in the first direction, a plurality of second data lines disposed in the second direction, and second subpixels defined by the plurality of second gate lines and the plurality of second data lines which cross each other, and wherein fourth wirings electrically connecting the first subpixels of the first display and the second subpixels of the third display are disposed on the fourth organic layer.

12. The display panel of claim 11, further comprising:

a gate glass substrate adjacent to the second glass substrate in the first direction and on which a second gate driver supplying gate pulses to the plurality of second gate lines is disposed;

a second organic layer connecting the second glass substrate and the gate glass substrate;

a data glass substrate adjacent to the third glass substrate in the second direction and on which a second data driver supplying data voltages to the plurality of second data line is disposed; and a fifth organic layer connecting the third glass substrate and the data glass substrate.

13. The display panel of claim 12, further comprising:

second wirings disposed on the second organic layer and electrically connecting the second gate driver and the second display; and fifth wirings disposed on the fifth organic layer and electrically connecting the second data driver and the third display.

14. The display panel of claim 13, wherein the first wirings and the second wirings are extended from the plurality of second gate lines, and wherein the fourth wirings and the fifth wirings are extended from the plurality of second data lines.

15. The display panel of claim 13, wherein each of the first to third displays includes:

a circuit layer disposed on the first to third glass substrates;

a light-emitting element layer disposed on the circuit layer;

an encapsulation layer covering the circuit layer and the light-emitting element layer;

a polarizing plate disposed on the encapsulation layer; and a cover glass disposed on the polarizing plate, wherein the first glass substrate and the second glass substrate form a predetermined angle around the first organic layer, wherein the first glass substrate and the third glass substrate form a predetermined angle around the fourth organic layer, wherein the second glass substrate and the gate glass substrate form a predetermined angle around the second organic layer, and wherein the third glass substrate and the data glass substrate form a predetermined angle around the fifth organic layer.

16. The display panel of claim 15, wherein the first glass substrate and the second glass substrate form an angle ranging from 0 to 90 degrees, wherein the first glass substrate and the third glass substrate form an angle ranging from 0 to 90 degrees, wherein the second glass substrate and the gate glass substrate form an angle ranging from 90 to 180 degrees, and wherein the third glass substrate and the data glass substrate form an angle ranging from 90 to 180 degrees.

17. The display panel of claim 11, wherein the first main wiring is disposed on the first organic layer, and wherein the first auxiliary wiring is disposed on an insulating layer covering the first main wiring, and is connected to the first main wiring through a contact hole penetrating the insulating layer.

18. The display panel of claim 11, wherein each of the second subpixels includes a first electrode, an organic compound layer disposed on the first electrode, and a second electrode disposed on the organic compound layer, and wherein the first auxiliary wiring includes a same material as the first electrode.

19. The display panel of claim 11, wherein each of the fourth wirings includes a fourth main wiring disposed on the fourth organic layer, and a fourth auxiliary wiring connected in parallel to the fourth main wiring, and wherein the fourth auxiliary wiring is disposed on an insulating layer covering the fourth main wiring, and is connected to the fourth main wiring through a contact hole penetrating the insulating layer.

20. The display panel of claim 19, wherein each of the second subpixels includes a first electrode, an organic compound layer disposed on the first electrode, and a second electrode disposed on the organic compound layer, and wherein the fourth auxiliary wiring includes the same material as the first electrode.

* * * * *